US008847401B2

(12) United States Patent
Chen et al.

(10) Patent No.: US 8,847,401 B2
(45) Date of Patent: Sep. 30, 2014

(54) SEMICONDUCTOR STRUCTURE INCORPORATING A CONTACT SIDEWALL SPACER WITH A SELF-ALIGNED AIRGAP AND A METHOD OF FORMING THE SEMICONDUCTOR STRUCTURE

(71) Applicant: International Business Machines Corporation, Armonk, NY (US)

(72) Inventors: Fen Chen, Williston, VT (US); Jeffrey P. Gambino, Westford, VT (US); Zhong-Xiang He, Essex Junction, VT (US); Xin Wang, Beacon, NY (US); Yanfeng Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/664,784

(22) Filed: Oct. 31, 2012

(65) Prior Publication Data
US 2014/0117420 A1 May 1, 2014

(51) Int. Cl.
| H01L 27/148 | (2006.01) |
| H01L 29/66 | (2006.01) |
| H01L 29/792 | (2006.01) |
| H01L 21/02 | (2006.01) |
| H01L 23/48 | (2006.01) |
| H01L 23/52 | (2006.01) |

(52) U.S. Cl.
USPC ........... 257/774; 257/249; 257/272; 257/324; 257/334; 257/384; 257/386

(58) Field of Classification Search
None
See application file for complete search history.

(56) References Cited

U.S. PATENT DOCUMENTS 6,362,073 B2    3/2002    Kim
(Continued)

OTHER PUBLICATIONS

Lung, S.L. et al., "A Low Temperature LNO/PZT/LNO Ferroelectric Capacitor-Over-Interconnect (COI) FeRAM Module for Modular SOC",Integrated Ferroelectrics, v 48, 149-60, 2002, Fourteenth International Symposium on Integrated Ferroelectrics, May 28,-Jun. 1, 2002 , Nara, Japan, Gordon & Breach, Netherlands.

(Continued)

*Primary Examiner* — Steven Loke
*Assistant Examiner* — Juanita B Rhodes
(74) *Attorney, Agent, or Firm* — Gibb & Riley, LLC; Michael J. LeStrange, Esq.

(57) ABSTRACT

Disclosed is a semiconductor structure incorporating a contact sidewall spacer with a self-aligned airgap and a method of forming the semiconductor structure. The structure comprises a semiconductor device (e.g., a two-terminal device, such as a PN junction diode or Schottky diode, or a three-terminal device, such as a field effect transistor (FET), a bipolar junction transistor (BJT), etc.) and a dielectric layer that covers the semiconductor device. A contact extends vertically through the dielectric layer to a terminal of the semiconductor device (e.g., in the case of a FET, to a source/drain region of the FET). A contact sidewall spacer is positioned on the contact sidewall and incorporates an airgap. Since air has a lower dielectric constant than other typically used dielectric spacer or interlayer dielectric materials, the contact size can be increased for reduced parasitic resistance while minimizing corresponding increases in parasitic capacitance or the probability of shorts.

25 Claims, 13 Drawing Sheets

(56) References Cited

U.S. PATENT DOCUMENTS

| | | |
|---|---|---|
| 7,091,567 B2 | 8/2006 | Park et al. |
| 7,094,669 B2 | 8/2006 | Bu et al. |
| 2005/0067673 A1 | 3/2005 | Geffken et al. |
| 2008/0283937 A1 | 11/2008 | Shin |
| 2010/0129974 A1* | 5/2010 | Futase et al. ............... 438/303 |
| 2012/0037962 A1* | 2/2012 | Breyta et al. ............... 257/288 |
| 2012/0153500 A1* | 6/2012 | Kim et al. .................. 257/774 |
| 2012/0199886 A1 | 8/2012 | Horak et al. |
| 2012/0217611 A1 | 8/2012 | Liu et al. |
| 2012/0217631 A1 | 8/2012 | Kim et al. |

OTHER PUBLICATIONS

Murota, et al., "Low-Temperature Silicon and Germanium CVD in Ultraclean Environment," Journal De Physique IV, Colloque C2, suppl. au Journal de Physique II, vol. 1, Sep. 1991, pp. C2-795-C2-802.

Williams, et al., "Etch Rates for Micromachining Processing—Part II," IEEE, Journal of Microelectromechanical Systems, vol. 12, No. 6, Dec. 2003, pp. 761-778.

Black, et al., "Polymer Self Assembly in Semiconductor Microelectronics," IBM J. Res. & Dev., vol. 51, No. 5, Sep. 2007, pp. 605-633.

* cited by examiner

SEMICONDUCTOR STRUCTURE INCORPORATING A CONTACT SIDEWALL SPACER WITH A SELF-ALIGNED AIRGAP AND A METHOD OF FORMING THE SEMICONDUCTOR STRUCTURE

BACKGROUND

1. Field of the Invention

The present disclosure relates to semiconductor structures and, more specifically, to embodiments of a semiconductor structure that incorporates a contact sidewall spacer with a self-aligned airgap and a method of forming the semiconductor structure.

2. Description of the Related Art

As technology scaling continues, the size of middle of the line (MOL) contacts for semiconductor devices in advanced very large-scale integrated (VLSI) circuits is shrinking, leading to increased parasitic resistance. The minimum dielectric spacing between a contact and other conductive semiconductor device components (e.g., the minimum dielectric spacing between a source/drain region contact and a gate structure in the case of a field effect transistor (FET)) is also shrinking, leading to an increase parasitic capacitance as well as a corresponding increase in the probability of a short. The increases in parasitic resistance, parasitic capacitance and the probability of a short, in turn, impact semiconductor device performance and reliability. Additionally, rapid adoptions of new device component materials (e.g., in the case of FETs, rapid adoptions of metal gate conductors, epitaxial silicon germanium (SiGe) source/drain regions, copper contacts, etc.) and rapid adoptions of new device configurations (e.g., in the case of FETs, rapid adoptions of raised source/drain regions, stress layers, fin-type semiconductor bodies, etc.) have further exacerbated these issues. Unfortunately, since an increase in contact size decreases parasitic resistance, but also increases parasitic capacitance and the probability of a short for a semiconductor device of a given size because of the corresponding decrease in dielectric spacing, and since an increase in dielectric spacing decreases parasitic capacitance and the probability of a short, but also increases parasitic resistance for a semiconductor device of a given size because of the corresponding decrease in contact size, semiconductor device design typically involves a trade-off between contact size and dielectric spacing.

SUMMARY

In view of the foregoing, disclosed herein are embodiments of a semiconductor structure that optimizes semiconductor device performance and reliability by incorporating a contact sidewall spacer with a self-aligned airgap. Specifically, the semiconductor structure can comprise a semiconductor device (e.g., a two-terminal semiconductor device, such as a PN junction diode or Schottky diode, or a three-terminal semiconductor device, such as a field effect transistor (FET), a bipolar junction transistor (BJT), a thrysistor, etc.) and a dielectric layer that covers the semiconductor device. A contact can extend vertically through the dielectric layer to a terminal of the semiconductor device (e.g., in the case of a FET, to a source/drain region of the FET). A contact sidewall spacer can be positioned laterally adjacent to the contact sidewall and can incorporate an airgap. Since air has a lower dielectric constant than other typically used dielectric spacer or interlayer dielectric materials, the contact size can be increased for reduced parasitic resistance while minimizing corresponding increases in parasitic capacitance or the probability of shorts. Also disclosed herein are embodiments of a method of forming such a semiconductor structure.

More particularly, disclosed herein are embodiments of a semiconductor structure. Generally, the semiconductor structure can comprise a semiconductor device. The semiconductor device can comprise any type of semiconductor device having contacted terminals including, but not limited to, a two-terminal semiconductor device (e.g., diode, such as a PN junction diode or a Schottky diode) or a three-terminal semiconductor device (e.g., a transistor, such as a field effect transistor (FET) or a bipolar junction transistor (BJT), or a thrysistor). The semiconductor structure can further comprise a dielectric layer covering the semiconductor device and a contact having a sidewall and extending vertically through the dielectric layer to the semiconductor device and, particularly, to a terminal of the semiconductor device. Finally, the semiconductor structure can comprise a contact sidewall spacer positioned laterally adjacent to the contact sidewall and comprising an airgap. For example, the contact sidewall spacer can comprise an airgap and a dielectric liner, which is positioned laterally between the airgap and the sidewall. Alternatively, the contact sidewall spacer can comprise an airgap, which is positioned laterally adjacent to a lower portion of the contact sidewall, and a dielectric cap, which is above the airgap and positioned laterally adjacent to an upper portion of the sidewall.

In one particular embodiment, the semiconductor structure can comprise a field effect transistor (FET). This FET can comprise a semiconductor body and a gate structure. The semiconductor body can comprise a channel region and a source/drain region adjacent to the channel region and the gate structure can be positioned on the semiconductor body adjacent to the channel region. The semiconductor structure can further comprise a dielectric layer covering the FET and a contact having a sidewall and extending vertically through the dielectric layer to the FET and, particularly, to a terminal of the FET (e.g., to the source/drain region). Finally, the semiconductor structure can comprise a contact sidewall spacer positioned laterally adjacent to the contact sidewall and comprising an airgap. For example, the contact sidewall spacer can comprise an airgap and a dielectric liner, which is positioned laterally between the airgap and the contact sidewall. Alternatively, the contact sidewall spacer can comprise an airgap, which is positioned laterally adjacent to a lower portion of the contact sidewall, and a dielectric cap, which is above the airgap and positioned laterally adjacent to an upper portion of the contact sidewall.

Also disclosed herein are embodiments of a method of forming a semiconductor structure. Generally, the method can comprise forming a semiconductor device. The semiconductor device can comprise any type of semiconductor device having contacted terminals including, but not limited to, a two-terminal semiconductor device (e.g., diode, such as a PN junction diode or a Schottky diode) or a three-terminal semiconductor device (e.g., a transistor, such as a field effect transistor (FET) or a bipolar junction transistor (BJT), or a thrysistor). Next, the method can comprise forming a dielectric layer so as to cover the semiconductor device. Finally, the method can comprise forming a contact having a sidewall and extending vertically through the dielectric layer to the semiconductor device and, particularly, to a terminal of the semiconductor device and further forming a contact sidewall spacer positioned laterally adjacent to the contact sidewall and comprising an airgap.

In one particular embodiment, the method can comprise forming a field effect transistor (FET). This FET can be formed so that it comprises semiconductor body and a gate structure. The semiconductor body can comprise a channel region and a source/drain region adjacent to the channel region and the gate structure can be positioned on the semiconductor body adjacent to the channel region. Next, the method can comprise forming a dielectric layer so as to cover the FET. Finally, the method can comprise forming a contact having a sidewall and extending vertically through the dielectric layer to the FET and, particularly, to a terminal of the FET (e.g., to a source/drain region) and further forming a contact sidewall spacer positioned laterally adjacent to the contact sidewall and comprising an airgap.

In any case, the processes of forming the contact and forming the contact sidewall spacer can comprise forming an opening in the dielectric layer extending vertically to the semiconductor device and, particularly, to a terminal of the semiconductor device (e.g., in the case of a FET, to a source/drain region of the FET). Then, a sacrificial liner comprising a degradable (i.e., decomposable) material, such as a thermally degradable material or chemically degradable material, can be formed in the opening and a dielectric liner can be formed on the sacrificial liner. Next, horizontal portions of both the dielectric liner and sacrificial liner can be removed from the opening. Once the horizontal portions of both the dielectric liner and sacrificial liner are removed from the opening, a contact can be formed in the opening such that the contact has a sidewall and extends vertically through the dielectric layer to the semiconductor device. After the contact is formed in the opening, an additional dielectric layer can be formed on the dielectric layer such that it covers the opening. Finally, one or more processes can be performed in order to degrade (i.e., decompose) any remaining degradable material of the sacrificial liner, thereby forming a contact sidewall spacer comprising an airgap and a remaining vertical portion of the dielectric liner positioned laterally between the airgap and the sidewall.

Alternatively, the processes of forming the contact and forming the contact sidewall spacer can comprise forming a first opening in the dielectric layer extending vertically to the semiconductor device and, particularly, to a terminal of the semiconductor device (e.g., in the case of a FET, to a source/drain region). Then, a sacrificial liner can be formed in the first opening and a horizontal portion of the sacrificial liner can be removed from the first opening. Once the horizontal portion of the sacrificial liner is removed from the first opening, a contact can be formed in the first opening such that the contact has a sidewall and extends vertically through the dielectric layer to the semiconductor device. After the contact is formed, a vertical portion of the sacrificial liner can be removed from the first opening so as to form a second opening, which exposes the contact sidewall. Finally, a dielectric cap can be formed in the second opening in order to form a contact sidewall spacer that comprises an airgap positioned laterally adjacent a lower portion of the contact sidewall and a dielectric cap above the airgap and positioned laterally adjacent to an upper portion of the contact sidewall.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
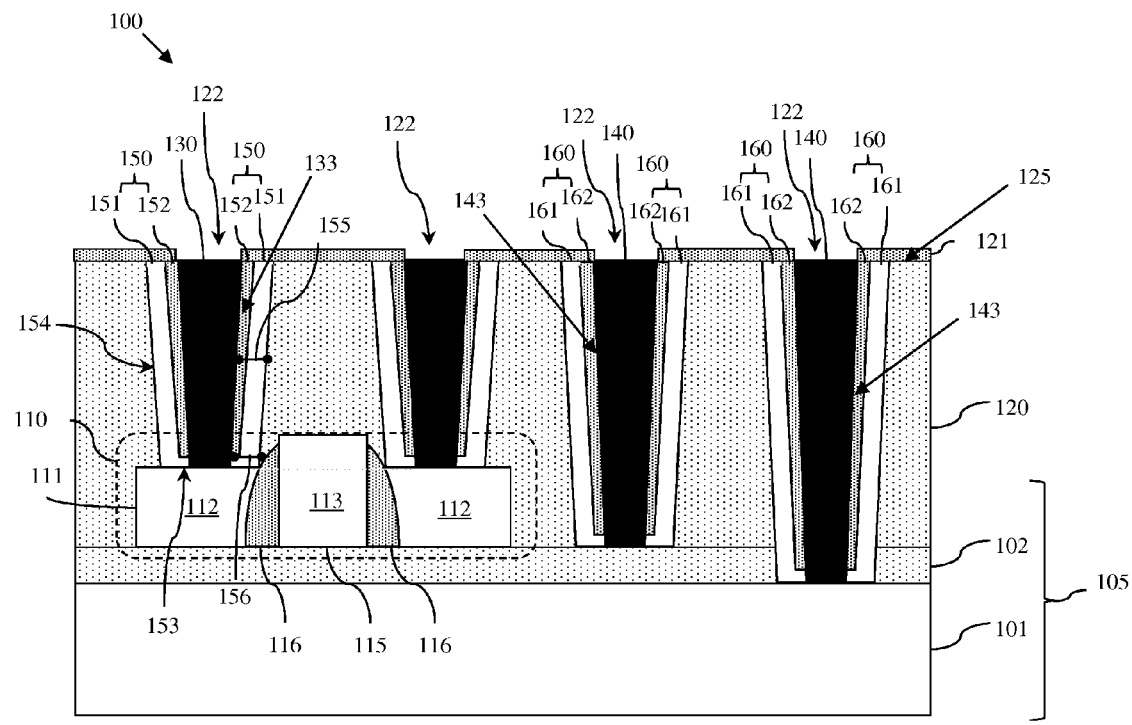
FIG. 1 is a diagram illustrating an embodiment of a semiconductor structure that incorporates a contact sidewall spacer with a self-aligned airgap.

As mentioned above, as technology scaling continues, the size of middle of the line (MOL) contacts for semiconductor devices in advanced very large-scale integrated (VLSI) circuits is shrinking, leading to increased parasitic resistance. The minimum dielectric spacing between a contact and other conductive semiconductor device components (e.g., the minimum dielectric spacing between a source/drain region contact and a gate structure in the case of a field effect transistor (FET)) is also shrinking, leading to an increase parasitic capacitance as well as a corresponding increase in the probability of a short. The increases in parasitic resistance, parasitic capacitance and the probability of a short, in turn, impact semiconductor device performance and reliability. Additionally, rapid adoptions of new device component materials (e.g., in the case of FETs, rapid adoptions of metal gate conductors, epitaxial silicon germanium (SiGe) source/drain regions, copper contacts, etc.) and rapid adoptions of new device configurations (e.g., in the case of FETs, rapid adoptions of raised source/drain regions, stress layers, fin-type semiconductor bodies, etc.) have further exacerbated these issues. Unfortunately, since an increase in contact size decreases parasitic resistance, but also increases parasitic capacitance and the probability of a short for a semiconductor device of a given size because of the corresponding decrease in dielectric spacing, and since an increase in dielectric spacing decreases parasitic capacitance and the probability of a short, but also increases parasitic resistance for a semiconductor device of a given size because of the corresponding decrease in contact size, semiconductor device design typically involves a trade-off between contact size and dielectric spacing.

In view of the foregoing, disclosed herein are embodiments of a semiconductor structure that optimizes semiconductor device performance and reliability by incorporating a contact sidewall spacer with a self-aligned airgap. Specifically, the semiconductor structure can comprise a semiconductor device (e.g., a two-terminal semiconductor device, such as a PN junction diode or Schottky diode, or a three-terminal semiconductor device, such as a field effect transistor (FET), a bipolar junction transistor (BJT), a thrysistor, etc.) and a dielectric layer that covers the semiconductor device. A contact can extend vertically through the dielectric layer to a terminal of the semiconductor device (e.g., in the case of a FET, to a source/drain region of the FET). A contact sidewall spacer can be positioned laterally adjacent to the contact sidewall and can incorporate an airgap. Since air has a lower dielectric constant than other typically used dielectric spacer or interlayer dielectric materials, the contact size can be increased for reduced parasitic resistance while minimizing corresponding increases in parasitic capacitance or the probability of shorts. Also disclosed herein are embodiments of a method of forming such a semiconductor structure.

Figure 2:
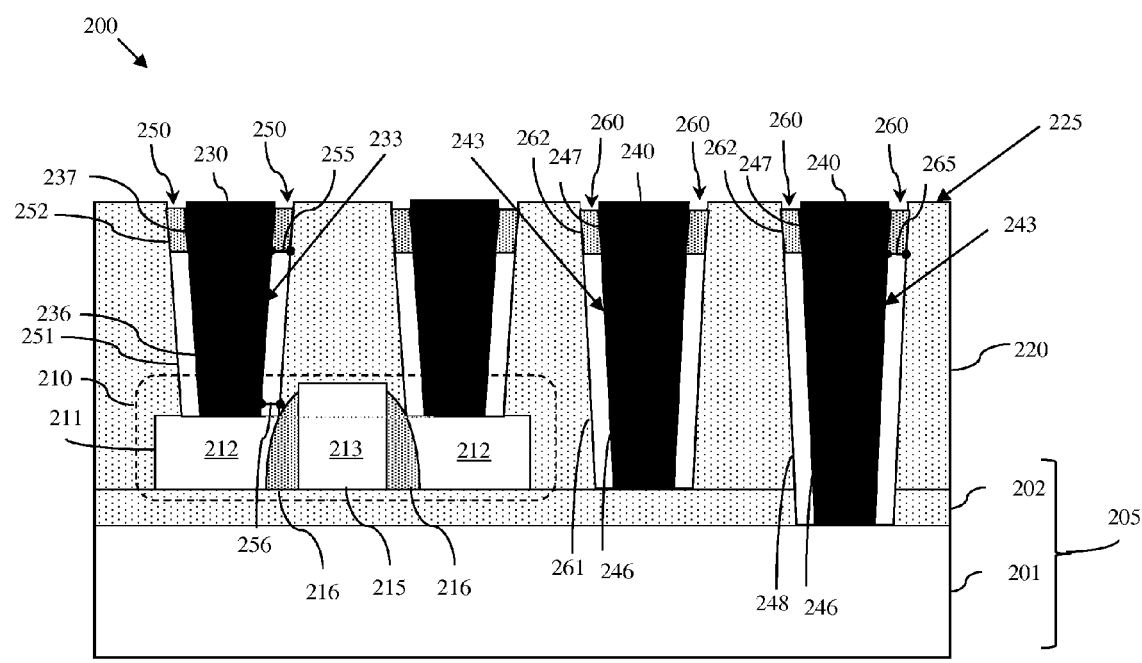
FIG. 2 is a diagram illustrating another embodiment of a semiconductor structure that incorporates a contact sidewall spacer with a self-aligned airgap.

More particularly, referring to FIGS. 1 and 2, disclosed herein are embodiments a semiconductor structure 100, 200. The semiconductor structure 100, 200 can comprise a semiconductor-on-insulator (SOI) wafer 105, 205 and a semiconductor device 110, 210 formed on a semiconductor wafer 105, 205.

As illustrated, the wafer 105, 205 can comprise a semiconductor-on-insulator (SOI) wafer. That is, it can comprise a semiconductor substrate 101, 201 (e.g., a silicon (Si) substrate or other semiconductor substrate), an insulator layer 102, 202 (e.g., a silicon dioxide ($SiO_2$) layer or other suitable insulator layer) on the substrate 101, 201 and a semiconductor layer (e.g., a single crystalline silicon (Si) layer, a single crystalline gallium nitride (GaN) layer or other suitable semiconductor layer). Alternatively, the wafer 105, 205 can comprise any other type of wafer suitable for use in semiconductor device formation. For example, the wafer 105, 205 can comprise a bulk semiconductor wafer (e.g., a bulk silicon wafer) or a hybrid orientation technology (HOT) wafer. Such wafers are well known in the art and, thus, the details thereof are omitted from this specification in order to allow the reader to focus on the salient aspects of the disclosed embodiments.

The semiconductor device 110, 210 can comprise any type of semiconductor device having contacted terminals including, but not limited to, two-terminal semiconductor devices and three-terminal semiconductor devices. For example, the semiconductor device 110, 210 can comprise a two-terminal semiconductor device and, particularly, a diode, such as a PN junction diode or a Schottky diode. Alternatively, the semiconductor device 110, 210 can comprise a three-terminal semiconductor device and, particularly, a transistor (e.g., field effect transistor (FET), a bipolar junction transistor (BJT), or a heterojunction bipolar transistor (HBT)) or a thrysistor. Such two-terminal and three-terminal semiconductor devices are well known in the art and, thus, the details thereof are omitted from this specification in order to allow the reader to focus on the salient aspects of the disclosed embodiments.

For purposes of illustration, the semiconductor device 110, 210 of the semiconductor structure 100, 200 is described herein and shown in the Figures as comprising a field effect transistor (FET) and, more particularly, a non-planar, multi-gate FET (MUGFET), such as a dual-gate (also referred to herein as a fin-type FET (FINFET)) or a tri-gate FET, formed on an SOI wafer 105, 205.

The MUGFET 110, 210 can comprise semiconductor body 111, 211 (e.g., an essentially fin-shaped semiconductor body) positioned above the insulator layer 102 and patterned from the semiconductor layer of the SOI wafer 105. This semiconductor body 111, 211 can comprise a channel region 113, 213 positioned laterally between source/drain regions 112, 212.

The MUGFET 110, 210 can further comprise a gate structure 115, 215 positioned on the top surface and opposing sidewalls of the semiconductor body 111, 211 adjacent to the channel region 113, 213. The gate structure 115, 215 can comprise a gate dielectric layer (e.g., a silicon dioxide ($SiO_2$) gate dielectric layer, a high K gate dielectric layer or other suitable gate dielectric layer) adjacent to the channel region 113, 213 and a gate conductor layer (e.g., a polysilicon gate conductor layer, a metal gate conductor layer or other suitable gate conductor layer) on the gate dielectric layer. Various different gate structure configurations for FETs and, particularly, for MUFGETs are well known in the art and, thus, the details thereof are omitted from this specification in order to allow the reader to focus on the salient aspects of the disclosed embodiments. However, those skilled in the art will recognize that in a FINFET, a dielectric cap (e.g., a silicon nitride (SiN) cap or other suitable dielectric cap layer) will typically isolate the top surface of the channel region from the gate structure so that only two-dimensional field effects are exhibited, whereas in a tri-gate FET a dielectric cap layer is not used so that three-dimensional field effects are exhibited.

The MUGFET 110, 210 can further comprise gate sidewall spacers 116, 216 positioned on opposing sidewalls of the gate structure 115, 215. These gate sidewall spacers 116, 216 can be single or multi-layered gate sidewall spacers and can comprise any suitable dielectric spacer material (e.g., silicon nitride (SiN), silicon dioxide ($SiO_2$), silicon oxynitride (SiON), etc.). Various different gate sidewall spacer configurations for FETs and, particularly, for MUFGETs are well known in the art and, thus, the details thereof are omitted from this specification in order to allow the reader to focus on the salient aspects of the disclosed embodiments.

In any case, the semiconductor structure 100, 200 can further comprise at least one dielectric layer 120, 220 covering (i.e., blanketing) the semiconductor device 110, 210. The dielectric layer(s) 120, 220 can comprise, for example, any one or more of the following: a silicon dioxide ($SiO_2$) layer, a borophosphosilicate glass (BPSG) layer, a silicon oxynitride (SiON) layer, a silicon nitride (SiN) layer and/or any other suitable interlayer dielectric material layer.

Additionally, middle of the line (MOL) contacts 130, 230, having essentially vertical sidewalls 133, 233, can extend vertically from the top surface 125, 225 of the dielectric layer(s) 120, 220 adjacent to back end of the line (BEOL) wires and/or interconnect structures (not shown) down to the semiconductor device 110, 210 and, particularly, down to the terminals of the semiconductor device 110, 210. For example, in the case of the MUGFET shown in FIGS. 1 and 2, the contacts 130, 230 can extend vertically from the top surface 125, 225 of the dielectric layer(s) 120, 220 down to the MUGFET terminals and, particularly, to each of the source/drain regions 112, 212 (as shown) and to the gate structure 115, 215 (not shown). Those skilled in the art will recognize that in semiconductor devices silicide layers are often formed on terminal surfaces (e.g., in the case of a FET, on the surfaces of the source/drain regions and gate structure) for reduced resistance. Thus, it should be understood that the contacts 130, 230 may, optionally, land on silicide layers (not shown) on the terminal surfaces of the semiconductor device 110, 210.

Optionally, one or more additional contacts 140, 240 can be offset from the semiconductor device 110, 210 (i.e., positioned laterally adjacent to the semiconductor device 110, 210), can have essentially vertical additional sidewalls 143, 243 and can extend vertically through the dielectric layer(s) 120, 220 to any layer below the semiconductor device 110, 210. For example, when the semiconductor device 110, 210 is formed on an SOI wafer 105, 205, additional contact(s) 140, 240 can extend vertically through the dielectric layer(s) 120, 220 stopping on the insulator layer 102, 202 and/or the semiconductor substrate 101, 201 below the semiconductor device 110, 210.

The above-mentioned contacts 130, 230 (as well as any additional contacts 140, 240) can each comprise a conductive body (i.e., a conductive plug). This conductive body can comprise a metal, a metal alloy, or a layered combination of metals and/or metal alloys including, but not limited to, any of the following: tungsten (W), copper (Cu), aluminum (Al), titanium (Ti), tantalum (Ta), tungsten nitride (WN), titanium nitride (TiN), tantalum nitride (TaN), ruthenium (Ru), rhodium (Rh), or any other suitable metal or metal alloy. MOL contact structures are well known in the art and, thus, the details thereof are omitted from this specification in order to allow the reader to focus on the salient aspects of the disclosed embodiments.

For each contact 130, 230 that extends vertically through the dielectric layer(s) 120, 220 to the semiconductor device 110, 210, the semiconductor structure 100, 200 can comprise a contact sidewall spacer 150, 250 positioned laterally adjacent to the contact sidewall 133, 233 so as to physically separate the contact(s) 130, 230 from the dielectric layer(s) 120, 220. Each contact sidewall spacer 150, 250 can comprise a self-aligned airgap 151, 251. It should be understood that for purposes of this disclosure an airgap refers to an air-filled or gas-filled space). Similarly, for each additional contact 140, 240 that extends vertically through the dielectric layer(s) 120, 220 to a layer below the semiconductor device 110, 210, the semiconductor structure 100, 200 can further comprise an additional contact sidewall spacer 160, 260 positioned laterally adjacent to the additional contact sidewall 143, 243 so as to physically separate the additional contact(s) 140, 240 from the dielectric layer(s) 120, 220. This additional contact sidewall spacer 160, 260 can be configured in essentially the same manner with essentially the same materials as the contact sidewall spacer 150, 250 and, thus, can comprise an additional self-aligned airgap 161, 261.

It should be noted that, while both the semiconductor structure 100 of FIG. 1 and the semiconductor structure 200 of FIG. 2 each incorporate a contact sidewall spacer having a self-aligned airgap, the contact sidewall spacers in the two semiconductor structures differ due to different processing techniques used to form them.

For example, referring to FIG. 1, in the semiconductor structure 100, the contact sidewall spacer 150 can comprise a self-aligned airgap 151 (i.e., an air or gas-filled spacer) that extends vertically the full height of the contact sidewall 133. That is, the self-aligned airgap 151 can extend from the top surface of the semiconductor device 110 to the top surface 125 of the dielectric layer(s) 120. The contact sidewall spacer 150 can further comprise a dielectric liner 152 positioned laterally between the airgap 151 and the contact sidewall 133. This dielectric liner 152 can be immediately adjacent to and can line the contact sidewall 133. This dielectric liner 152 can comprise, for example, a silicon nitride (SiN) liner, a silicon oxynitride (SiON) liner, or any other suitable dielectric liner. Due to the process steps used to create such a contact sidewall spacer 150, the airgap 151 may comprise a vertical portion 154 and a relatively short horizontal portion 153 that extends laterally from the vertical portion 154 below the dielectric liner 152 to the contact sidewall 133. Thus, the dielectric liner 152 may be physically separated from the top surface of the semiconductor device 110.

It should be noted that the width 155 of the contact sidewall spacer 150 will be essentially uniform (i.e., the width of the contact sidewall spacer will be essentially from the semiconductor device 110 to the top surface 125 of the dielectric layer(s) 120) and will be approximately equal to the sum of the thicknesses of the airgap 151 and, particularly, the vertical portion 154 of the airgap 151 and the dielectric liner 152. The airgap 151 can have a width ranging from less than 1 nm to greater than 10 nm, the dielectric liner 152 can also have a width ranging from less than 1 nm to greater than 10 nm and, thus, the full width 155 of the contact sidewall spacer 150 can range from less than 2 nm to greater than 20 nm. In one exemplary embodiment, the airgap 151 and, particularly, the vertical portion 154 of the airgap 151 can have a width of approximately 2 nm, the dielectric liner 152 can have a width of 2-3 nm, and, thus, the full width 155 of the contact sidewall spacer 150 can be approximately 4-5 nm. It should be noted that in the case of a contact 130 to a source/drain region 112 of a FET, this full width 155 can be approximately equal to the distance 156 between the contact sidewall 133 and the outer edge of the gate sidewall spacer 116.

As mentioned above, an additional contact sidewall spacer 160 adjacent to an additional contact 140, which is offset from the semiconductor device 110 and extends vertically through the dielectric layer(s) 120 to a layer below the semiconductor device 110, can be configured in essentially the same manner with essentially the same materials as the contact sidewall spacer 150. Thus, in this semiconductor structure 100, an additional contact sidewall spacer 160 can comprise an additional self-aligned airgap 161 (i.e., an air or gas-filled spacer) that extends vertically the full height of the sidewall 133 of an additional contact 140. This additional contact sidewall spacer 160 can further comprise an additional dielectric liner 162 (e.g., a silicon nitride (SiN) liner, a silicon oxynitride (SiON) liner, or any other suitable dielectric liner) positioned immediately adjacent to and lining the sidewall 143 of the additional contact 140 and further positioned laterally between the additional airgap 161 and the sidewall 143.

Lastly, the semiconductor structure 100 can further comprise an additional dielectric layer 121 positioned on the top surface 125 of the dielectric layer(s) 120. This additional dielectric layer 121 can extend laterally over the contact(s) 130 and contact sidewall spacer(s) 150 (as well as over any additional contact(s) 140 and additional contact sidewall spacer(s) 160). This additional dielectric layer 121 can comprise the same dielectric material as or a different dielectric material than the dielectric liner 152 of the contact sidewall spacer 150 and, thus, can comprise, for example, a silicon nitride (SiN) layer, a silicon oxynitride (SiON) layer, or any other suitable dielectric layer. It should be noted that the additional dielectric layer 121 can also have openings 122, which are aligned above the contacts 130, 140 and which are etched during BEOL processing to allow for electrical connections between the contacts 130, 140 and BEOL wires and/or interconnects above.

Alternatively, referring to FIG. 2, in the semiconductor structure 200, the contact sidewall spacer 250 can comprise a self-aligned airgap 251 (i.e., an air or gas-filled space) positioned laterally immediately adjacent to (i.e., in contact with) a lower portion 236 of the contact sidewall 233 and a dielectric cap 252 above the airgap 251 and positioned laterally immediately adjacent to (i.e., in contact with) an upper portion 237 of the contact sidewall 236. The dielectric cap 252 can comprise, for example, a silicon nitride (SiN) cap, a silicon oxynitride (SiON) cap, or any other suitable dielectric cap. The width 255 of the contact sidewall spacer 250 can be essentially uniform (i.e., the airgap 251 and dielectric cap 252 above the airgap 251 can have essentially the same width). This width 255 can range from less than 2 nm to greater than 20 nm. In one exemplary embodiment, this width 255 can be approximately 2 nm. It should be noted that in the case of a contact 230 to the source/drain region 212 of a FET, this width 255 can be approximately equal to the distance 256 between the contact sidewall 233 and the outer edge of the gate sidewall spacer 216.

As mentioned above, an additional contact sidewall spacer 260 adjacent to an additional contact 240, which is offset from the semiconductor device 210 and extends vertically through the dielectric layer(s) 220 to a layer below the semiconductor device 210, can be configured in essentially the same manner with essentially the same materials as the contact sidewall spacer 250. Thus, in the semiconductor structure 200, an additional contact sidewall spacer 260 can comprise an additional self-aligned airgap 261 (i.e., an air or gas-filled spacer) positioned laterally immediately adjacent to (i.e., in contact with) a lower portion 246 of the sidewall 243 of an additional contact 240. This additional contact sidewall spacer 260 can further comprise an additional dielectric cap 262 (e.g., a silicon nitride (SiN) cap, a silicon oxynitride (SiON) cap, or any other suitable dielectric cap) above the additional airgap 261 and positioned laterally immediately adjacent to (i.e., in contact with) an upper portion 247 of the sidewall 243.

In each of the above described semiconductor structures 100 of FIG. 1 and 200 of FIG. 2, since the air or gas in the airgaps of the contact sidewall spacers has a lower dielectric constant than other typically used dielectric spacer or interlayer dielectric materials (e.g., a lower dielectric constant than silicon dioxide ($SiO_2$), borophosphosilicate glass (BPSG) layer, silicon nitride (SiN) or silicon oxynitride (SiON)), the size of the corresponding contacts can be increased for reduced parasitic resistance while minimizing corresponding increases in parasitic capacitance or the probability of shorts with any adjacent conductive structure (e.g., with an adjacent gate structure, with an adjacent contact, etc.).

Figure 3:
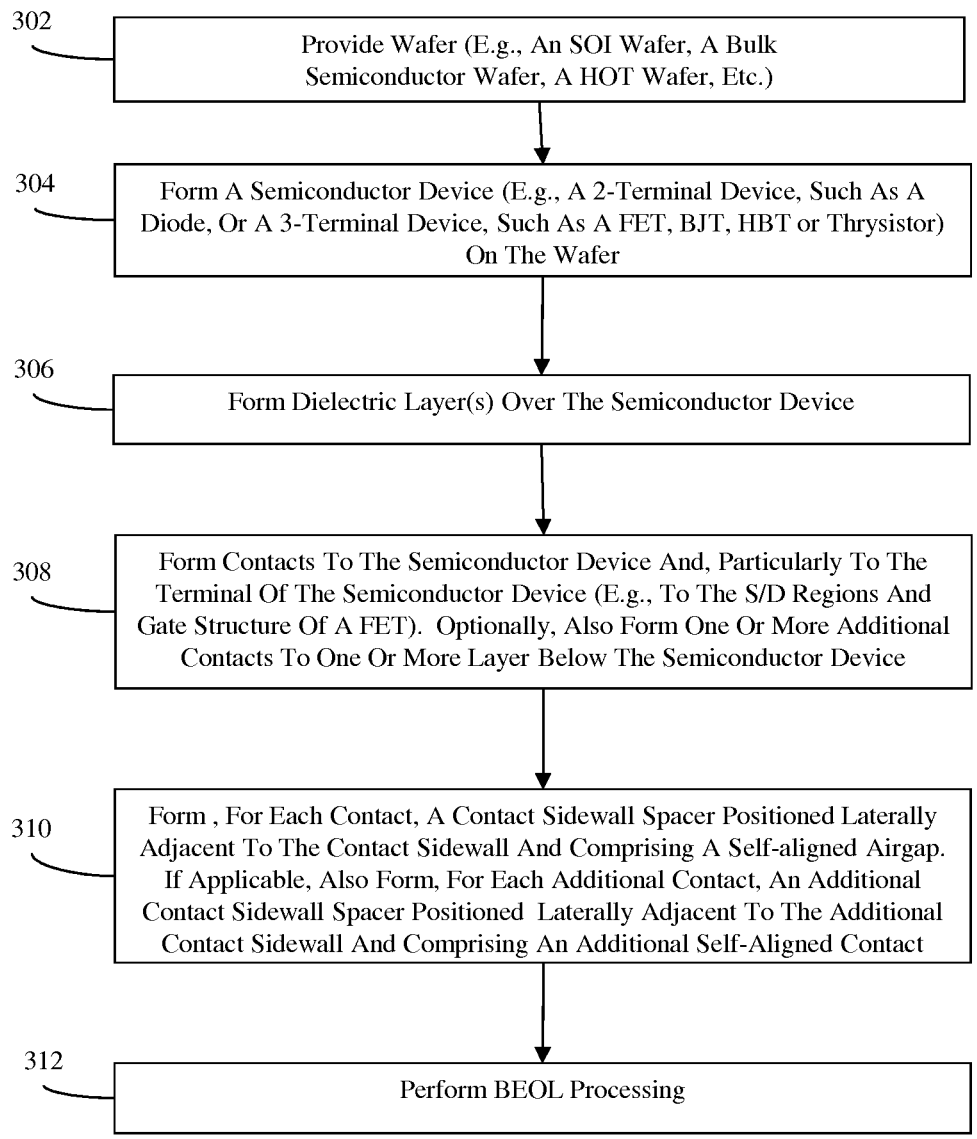
FIG. 3 is a flow diagram illustrating embodiments of a method of forming the semiconductor structure of FIG. 1 or of FIG. 2.
Figure 4:
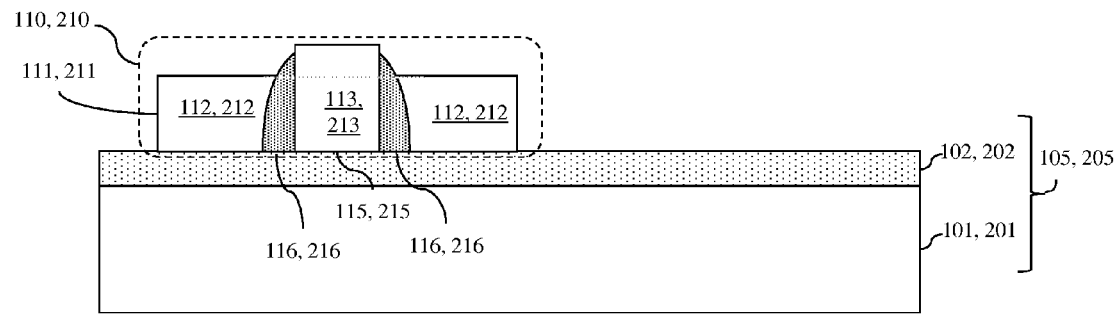
FIG. 4 is a diagram illustrating a partially completed semiconductor structure formed according to the method of FIG. 3.

Referring to the flow diagram of FIG. 3, also disclosed herein are embodiments of a method of forming a semiconductor structure, such as the semiconductor structure 100 of FIG. 1 or the semiconductor 200 of FIG. 2. As indicated in FIG. 3, the method can comprise providing a wafer 105, 205 (302) and forming a semiconductor device 110, 210 on the wafer 105, 205 using conventional processing techniques (304, see FIG. 4).

The wafer 105, 205 provided at process 302 can comprise a semiconductor-on-insulator (SOI) wafer. That is, it can comprise a semiconductor substrate 101, 201 (e.g., a silicon (Si) substrate or other semiconductor substrate), an insulator layer 102, 202 (e.g., a silicon dioxide ($SiO_2$) layer or other suitable insulator layer) on the substrate 101, 201 and a semiconductor layer (e.g., a single crystalline silicon (Si) layer, a single crystalline gallium nitride (GaN) layer or other suitable semiconductor layer). Alternatively, the wafer 105, 205 can comprise any other type of wafer suitable for use in semiconductor device formation. For example, the wafer 105, 205 can comprise a bulk semiconductor wafer (e.g., a bulk silicon wafer) or a hybrid orientation technology (HOT) wafer. Such wafers are well known in the art and, thus, the details thereof are omitted from this specification in order to allow the reader to focus on the salient aspects of the disclosed embodiments.

The semiconductor device 110, 210 formed at process 304 can comprise any type of semiconductor device having contacted terminals including, but not limited to, two-terminal semiconductor devices and three-terminal semiconductor devices. For example, the semiconductor device 110, 210 can comprise a two-terminal semiconductor device and, particularly, a diode, such as a PN junction diode or a Schottky diode. Alternatively, the semiconductor device 110, 210 can comprise a three-terminal semiconductor device and, particularly, a transistor (e.g., field effect transistor (FET), a bipolar junction transistor (BJT), or a heterojunction bipolar transistor (HBT)) or a thrysistor. Such two-terminal and three-terminal semiconductor devices are well known in the art and, thus, the details thereof are omitted from this specification in order to allow the reader to focus on the salient aspects of the disclosed embodiments.

For purposes of illustration, the semiconductor device 110, 210 formed at process 304 is described herein and shown in the Figures as comprising a field effect transistor (FET) and, more particularly, a non-planar, multi-gate FET (MUGFET), such as a dual-gate (also referred to herein as a fin-type FET (FINFET)) or a tri-gate FET, formed on an SOI wafer 105, 205.

The MUGFET 110, 210 can be formed at process 304 such that it comprises semiconductor body 111, 211 (e.g., an essentially fin-shaped semiconductor body) positioned above the insulator layer 102 and patterned from the semiconductor layer of the SOI wafer 105. This semiconductor body 111, 211 can comprise a channel region 113, 213 positioned laterally between source/drain regions 112, 212.

The MUGFET 110, 210 can further be formed at process 304 such that it comprises a gate structure 115, 215 positioned on the top surface and opposing sidewalls of the semiconductor body 111, 211 adjacent to the channel region 113, 213. The gate structure 115, 215 can comprise a gate dielectric layer (e.g., a silicon dioxide ($SiO_2$) gate dielectric layer, a high K gate dielectric layer or other suitable gate dielectric layer) adjacent to the channel region 113, 213 and a gate conductor layer (e.g., a polysilicon gate conductor layer, a metal gate conductor layer or other suitable gate conductor layer) on the gate dielectric layer. Various different techniques for forming gate structures for FETs and, particularly, for MUFGETs are well known in the art and, thus, the details thereof are omitted from this specification in order to allow the reader to focus on the salient aspects of the disclosed embodiments. However, those skilled in the art will recognize that in a FINFET, a dielectric cap (e.g., a silicon nitride (SiN) cap or other suitable dielectric cap layer) will isolate the top surface of the channel region from the gate structure so that only two-dimensional field effects are exhibited, whereas in a tri-gate FET a dielectric cap layer is not used so that three-dimensional field effects are exhibited.

The MUGFET 110, 210 can further be formed at process 304 such that it comprises gate sidewall spacers 116, 216 positioned on opposing sidewalls of the gate structure 115, 215. These gate sidewall spacers 116, 216 can be single or multi-layered gate sidewall spacers and can comprise any suitable dielectric material (e.g., silicon nitride (SiN), silicon dioxide ($SiO_2$), silicon oxynitride (SiON), etc.). Various different techniques for forming gate sidewall spacers for FETs and, particularly, for MUFGETs are well known in the art and, thus, the details thereof are omitted from this specification in order to allow the reader to focus on the salient aspects of the disclosed embodiments.

Figure 5:
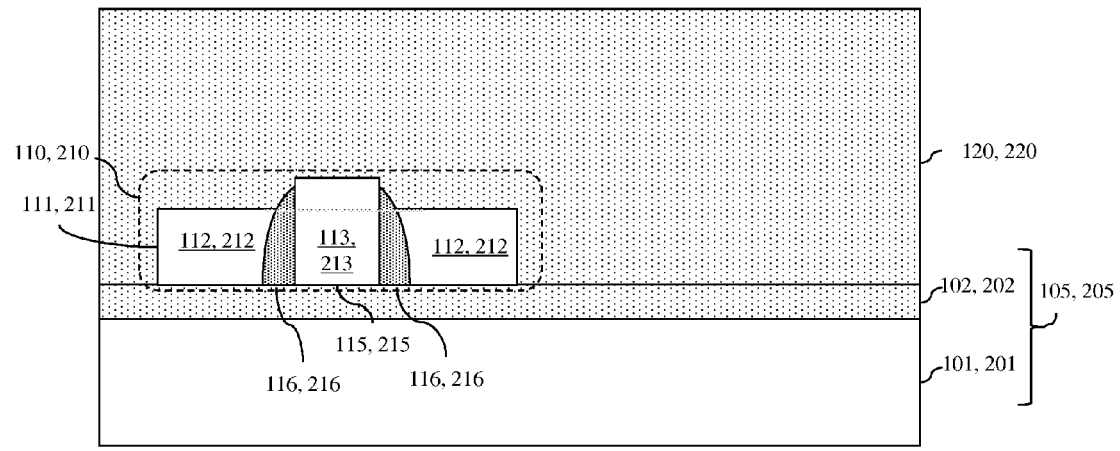
FIG. 5 is a diagram illustrating a partially completed semiconductor structure formed according to the method of FIG. 3.

Next, the method can comprise forming (e.g., depositing) at least one dielectric layer 120, 220 so as to cover and, particularly, blanket the semiconductor device 110, 210 (306, see FIG. 5). The dielectric layer(s) 120, 220 formed at process 306 can comprise, for example, any one or more layers of the following interlayer dielectric materials: silicon dioxide ($SiO_2$), borophosphosilicate glass (BPSG), silicon oxynitride (SiON), silicon nitride (SiN) and/or any other suitable layer of interlayer dielectric material. Techniques for forming such dielectric layers are well known in the art and, thus, the details thereof are omitted from this specification in order to allow the reader to focus on the salient aspects of the disclosed embodiments.

Finally, the method can comprise forming contacts 130, 230, each having a sidewall 133, 233 and extending vertically through the dielectric layer(s) 120, 220 to the semiconductor device 110, 210 and, particularly, to a terminal of the semiconductor device 110, 210 (e.g., in the case of a FET, to a source/drain region 112, 212, as shown, or the gate structure 115, 215 of the FET) (308) and further forming, for each contact 130, 230, a contact sidewall spacer 150, 250 positioned laterally adjacent to the contact sidewall 133, 233 and comprising an airgap 151, 251 (310, see FIG. 1 and FIG. 2). Optionally, the process steps 308-310 can also comprise essentially simultaneously forming one or more additional contacts 140, 240, each having an additional sidewall 143, 243 and extending vertically through the dielectric layer(s) 120, 220 to a layer below the semiconductor device 110, 210 (e.g., to an insulator layer 102, 202 or a semiconductor substrate 101, 201 below the semiconductor device 110, 210) and further forming, for each additional contact 140, 240, an additional contact sidewall spacer 160, 260 positioned laterally adjacent to the additional contact sidewall 143, 243 and comprising an additional airgap 161, 261.

It should be noted that different processing techniques may be used to perform processes 308-310 so that, while both the resulting semiconductor structures 100 of FIG. 1 and 200 of FIG. 2 each incorporate a contact sidewall spacer having a self-aligned airgap, the contact sidewall spacers in the resulting semiconductor structures differ in their configuration.

Figure 6:
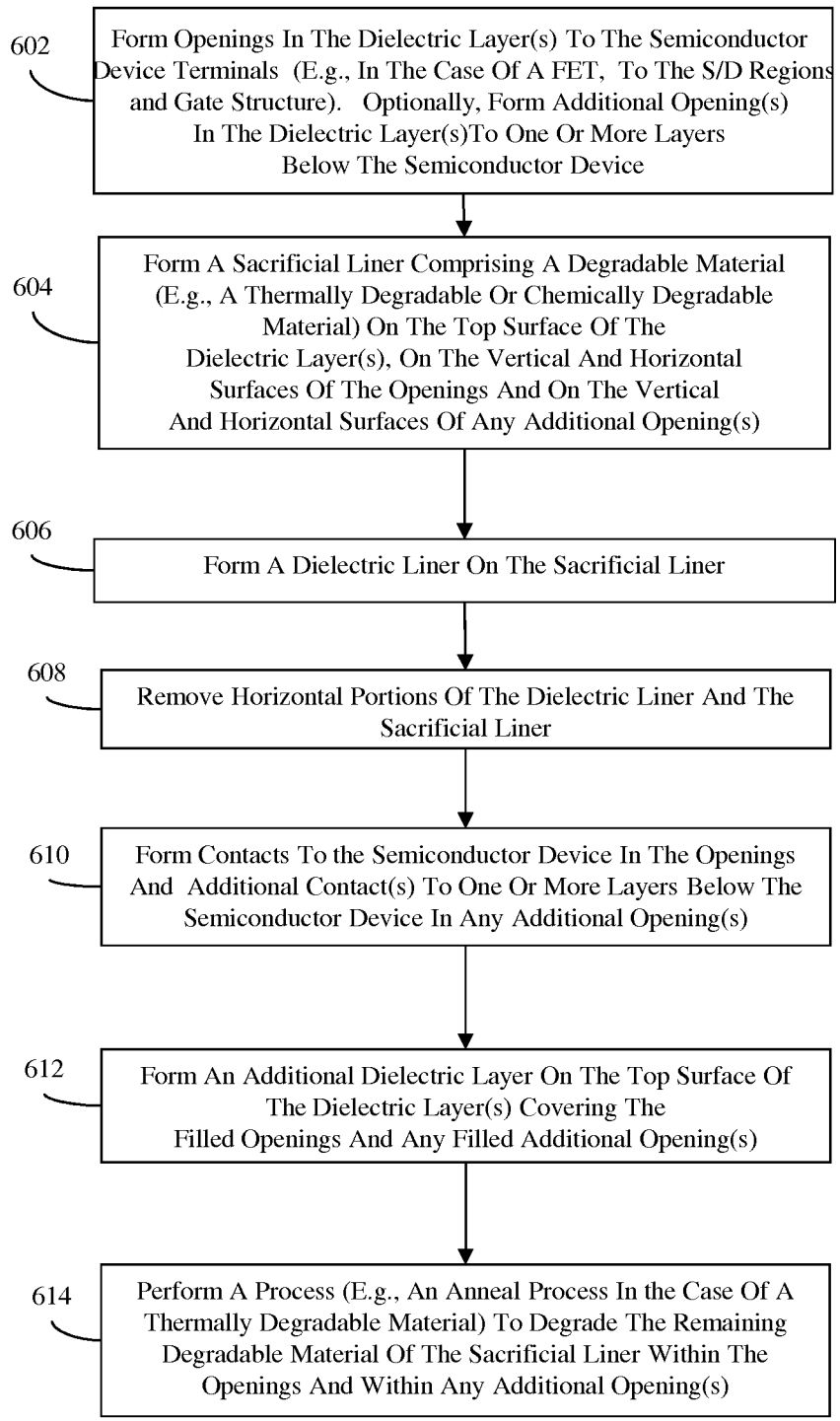
FIG. 6 is a flow diagram illustrating an exemplary technique for performing the processes 308-310 of FIG. 3 in order to form the semiconductor structure of FIG. 1.

For Example, FIG. 6 is a flow diagram illustrating an exemplary technique for performing the processes 308-310 resulting in the semiconductor structure 100 of FIG. 1.

Figure 7:
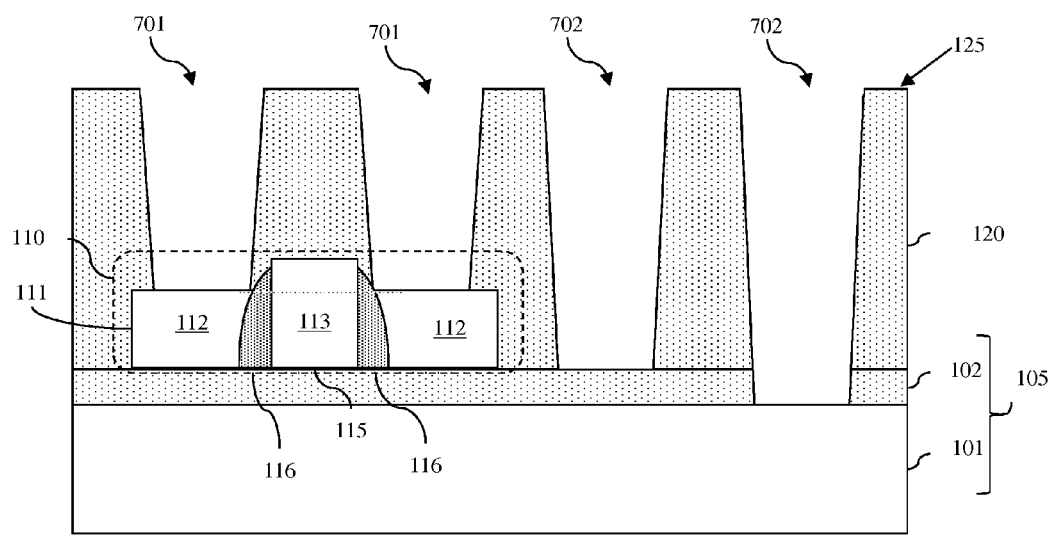
FIG. 7 is a diagram illustrating a partially completed semiconductor structure formed using the technique of FIG. 6.

Specifically, referring to FIG. 6, the processes 308-310 can begin by forming openings 701 in the dielectric layer(s) 120 extending vertically from the top surface 125 of the dielectric layer(s) 120 to the semiconductor device 110 and, particularly, to the terminals of the semiconductor device 110 (602, see FIG. 7). For example, in the case of a FET, openings 701 can be formed that extend vertically through the dielectric layer(s) 120 the source/drain regions 112 (as shown) and also to the gate structure 115 (not shown)). Those skilled in the art will recognize that silicide layers are often formed on the surfaces of semiconductor device terminals for reduced resistance. For example, in the case of a FET, silicide layers are often formed on the surfaces of the source/drain regions and/or the gate structure. Thus, it should be understood that the openings 701 may, optionally, land on silicide layers (not shown). Optionally, at process 602, one or more additional openings 702 can also be formed in the dielectric layer(s) 120 offset from the semiconductor device 110 (i.e., positioned laterally adjacent to the semiconductor device 110) and extending vertically from the top surface 125 of dielectric layer(s) 120 to one or more layers below the semiconductor device 110 (e.g., to an insulator layer 102 or semiconductor substrate 101 below the semiconductor device 110). The openings 701 and any additional opening(s) 702 can be formed using conventional lithographic patterning and reactive ion etch (RIE) techniques or any other suitable patterning and etch techniques.

Figure 8:
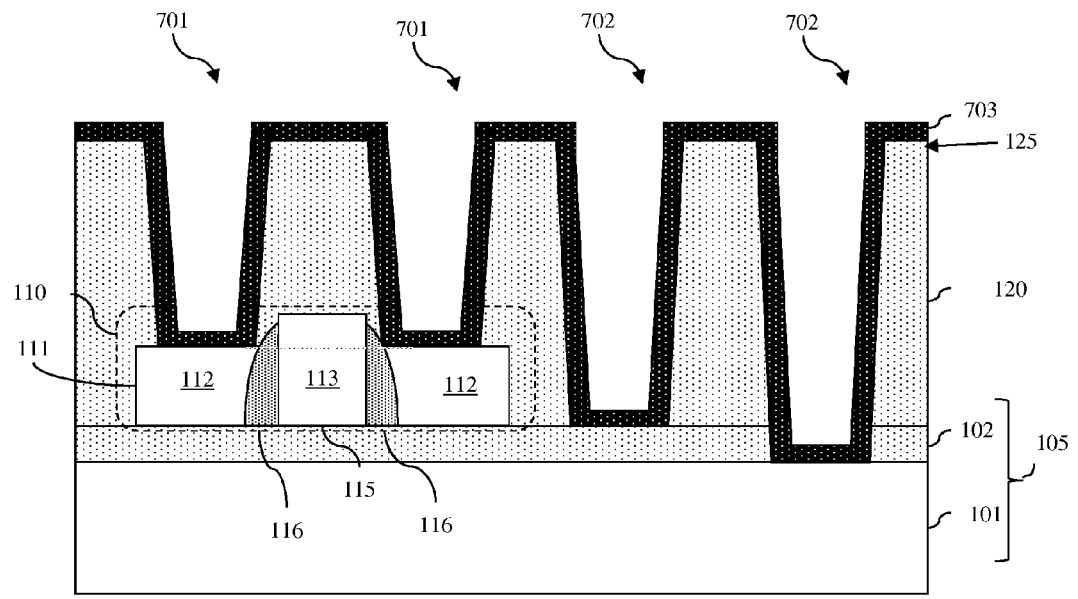
FIG. 8 is a diagram illustrating a partially completed semiconductor structure formed using the technique of FIG. 6.

Next, a sacrificial liner 703 can be formed (e.g., deposited) so as to conformally cover the top surface 125 of the dielectric layer(s) 120, the vertical and horizontal surfaces of the openings 701 and the horizontal and vertical surfaces of any additional opening(s) 702 (604, see FIG. 8). This sacrificial liner 703 can comprise a degradable (i.e., decomposable) material, such as a thermally degradable material or a chemically degradable material. For example, this sacrificial liner 703 can comprise a thermally degradable polymer material or any other suitable thermally degradable material that will decompose into a gaseous state when the temperature of the material is raised above a decomposition temperature and/or when the material is exposed to ultra-violet (UV) radiation. Alternatively, this sacrificial liner 703 can comprise a chemically degradable and, particularly, a selectively etchable material (e.g., a germanium or a silicon germanium (SiGe)).

Figure 9:
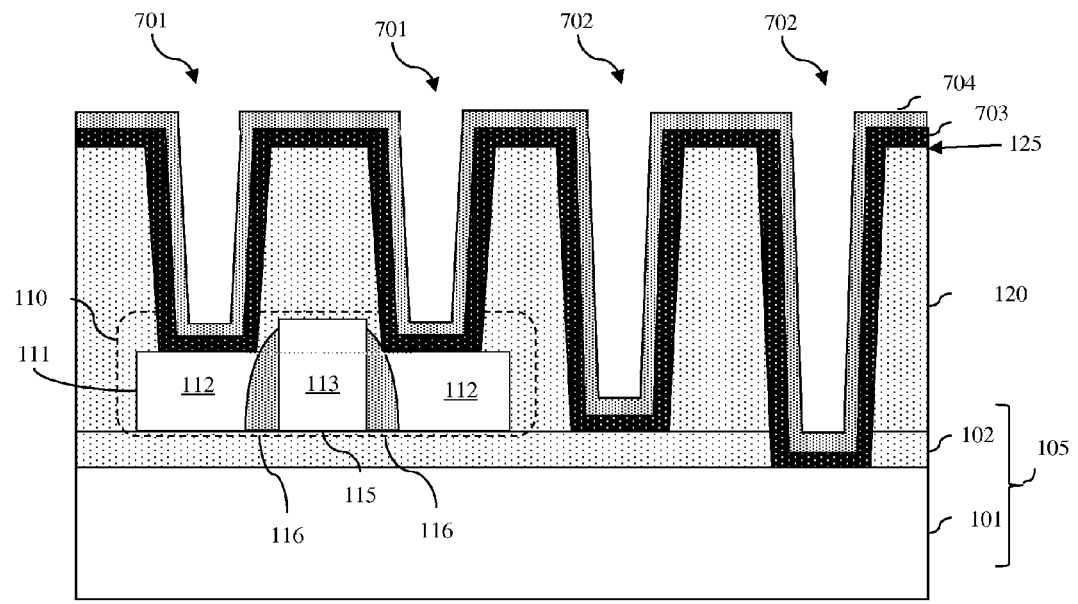
FIG. 9 is a diagram illustrating a partially completed semiconductor structure formed using the technique of FIG. 6.

Following deposition of the sacrificial liner 703, a dielectric liner 704 can be formed (e.g., deposited) so as to conformally cover the sacrificial liner 703 (606, see FIG. 9). This dielectric liner 704 can comprise, for example, a silicon nitride (SiN) liner, a silicon oxynitride (SiON) liner, or any other suitable dielectric liner. In one exemplary embodiment, this dielectric liner 704 can be deposited so that it is approximately 2-3 nm thick.

Figure 10:
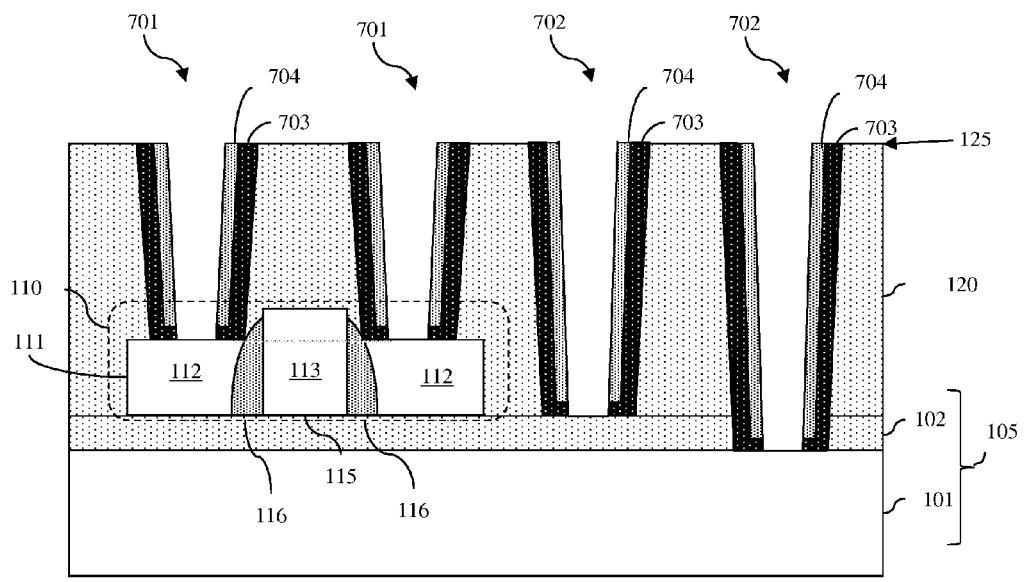
FIG. 10 is a diagram illustrating a partially completed semiconductor structure formed using the technique of FIG. 6.

Next, horizontal portions of both the dielectric liner 704 and sacrificial liner 703 can be removed from the top surface 125 of the dielectric layer(s) 120, from the openings 701 and from any additional opening(s) 702 (608, see FIG. 10). Removing the horizontal portions of the dielectric and sacrificial liners 704 and 703 from the openings 701 will expose surfaces of the terminals of the semiconductor device 110 to be contacted and, similarly, removing the horizontal portions of the dielectric and sacrificial liners 704 and 703 from any additional opening(s) 702 will expose surface(s) of the layers below the semiconductor device 110 to be contacted. To remove the horizontal portions of the dielectric and sacrificial liners 704 and 703 at least one directional etch process (e.g., a plasma etch process) can be performed. For example, a fluorine (F)-based reactive ion etch (RIE) process can be used to remove dielectric 704 and an oxygen ($O_2$) or hydrogen ($H_2$)-based reactive ion etch (RIE) process can be used to remove the sacrificial liner 703.

Figure 11:
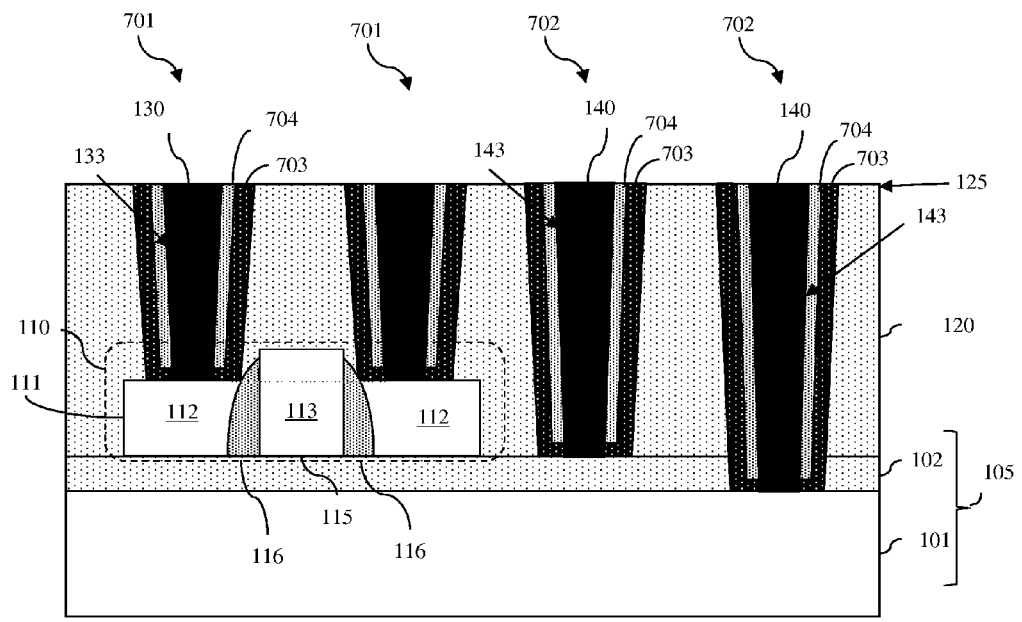
FIG. 11 is a diagram illustrating a partially completed semiconductor structure formed using the technique of FIG. 6.

Once the horizontal portions of both the dielectric and sacrificial liners 704 and 703 are removed, contacts 130 can be formed in the openings 701 such that each contact 130 has a sidewall 133 and extends vertically through the dielectric layer(s) 120 to a terminal of the semiconductor device 110 (e.g., in the case of a FET, to a source/drain region 112 (as shown) or the gate structure 115 (not shown)) (610, see FIG. 11). At process 610, additional contact(s) 140 can also be formed in any additional opening(s) 702 such that each additional contact 140 has an additional sidewall 143 and extends vertically through the dielectric layer(s) 120 to a layer below the semiconductor device 110 (e.g., to an insulator layer 102 or a semiconductor substrate 101 below the semiconductor device 110). To form the contacts 130 and any additional contact(s) 140, the openings 701 and any additional opening(s) 702 can be filled with a conductive body (i.e., a conductive plug) and this conductive body can comprise a metal, a metal alloy, or a layered combination of metals and/or metal alloys including, but not limited to, any of the following: tungsten (W), copper (Cu), aluminum (Al), titanium (Ti), tantalum (Ta), tungsten nitride (WN), titanium nitride (TiN), tantalum nitride (TaN), a (Ru), rhodium (Rh), or any other suitable metal or metal alloy. Techniques for forming such conductive bodies are well known in the art and, thus, the details thereof are omitted from this specification in order to allow the reader to focus on the salient aspects of the disclosed embodiments.

Figure 12:
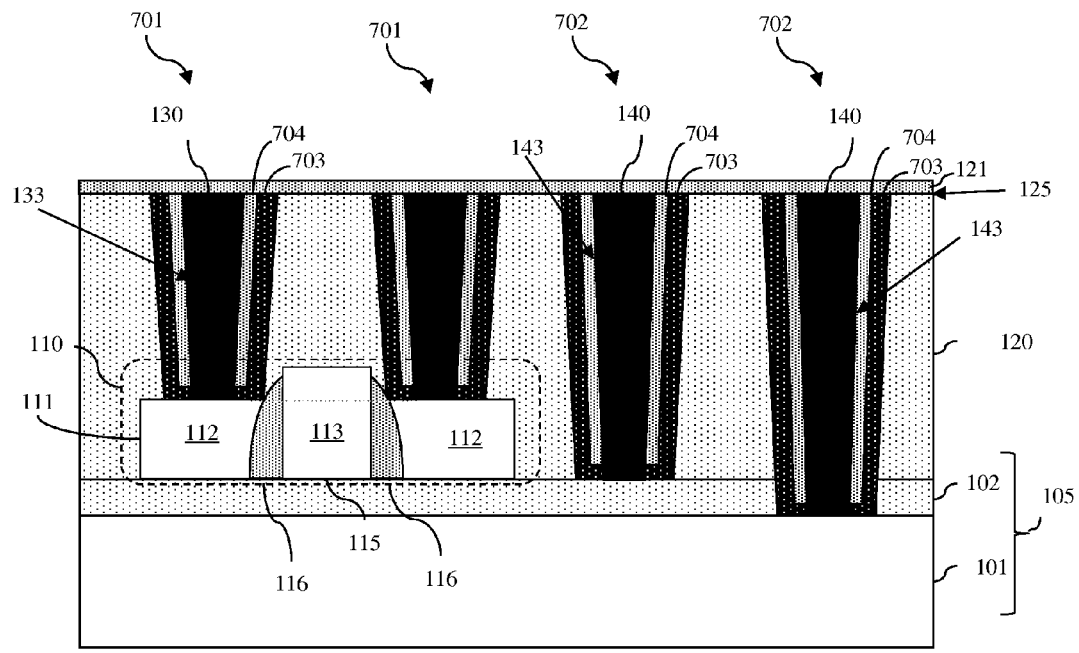
FIG. 12 is a diagram illustrating a partially completed semiconductor structure formed using the technique of FIG. 6.

After forming the contacts 130 and any additional contacts 140 at process 610, any metal or metal alloy material remaining on the top surface 125 of the dielectric layer(s) 120 can be removed (e.g., using a chemical mechanical polishing (CMP) process). Then, an additional dielectric layer 121 can be formed (e.g., deposited) on the top surface 125 of the dielectric layer(s) 120 such that it covers each of the openings 701, which contain vertical portions of the sacrificial liner 703 and dielectric liner 704 laterally surrounding the contact 130, and any additional openings 702, which similarly contain with vertical portions of the sacrificial liner 703 and dielectric liner 704 laterally surrounding the additional contact 140 (612, see FIG. 12). This additional dielectric layer 121 can comprise the same dielectric material as or a different dielectric material than the dielectric liner 704 and, thus, can comprise, for example, a silicon nitride (SiN) layer, a silicon oxynitride (SiON) layer, or any other suitable dielectric layer.

Then, one or more processes can be performed in order to degrade (i.e., decompose) any remaining degradable material of the sacrificial liner 703 within the openings 701 and within any filled additional openings 702 to form self-aligned airgaps (i.e., air cavities) (614).

Figure 13:
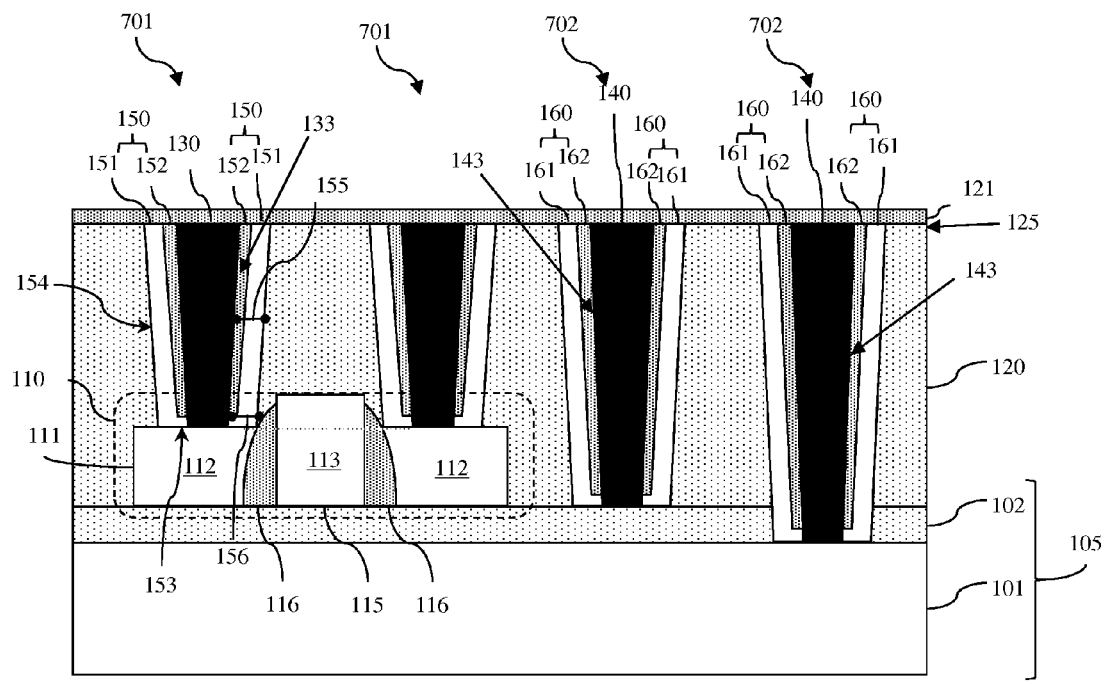
FIG. 13 is a diagram illustrating a partially completed semiconductor structure formed using the technique of FIG. 6.

For example, if the degradable material used for the sacrificial liner 703 comprises a thermally degradable polymer (TDP), the TDP may be heated in an anneal process to its decomposition temperature (e.g., 400-500° C.) and, if required, exposed to an ultraviolent (UV) light source, thus, decomposing it into a gaseous state and creating the self-aligned airgap (see FIG. 13).

Figure 14:
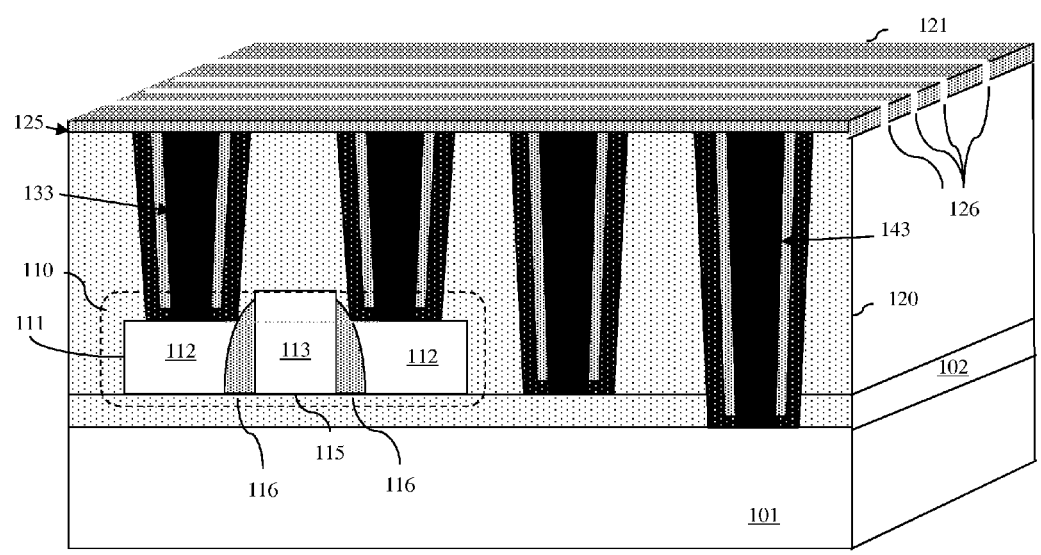
FIG. 14 is a diagram illustrating a partially completed semiconductor structure formed using the technique of FIG. 6.

Alternatively, if the degradable material used for the sacrificial liner 703 comprises a chemically degradable material (i.e., a selectively etchable material, such as germanium (Ge) or silicon germanium (SiGe), sub-lithographic openings 126 (e.g., openings having dimensions of less than 50 nm and preferably of 20 nm or less) can be formed in the additional dielectric layer 121 exposing the sacrificial liner material each of the opening 701 and any additional openings 702 (see FIG. 14). Then, an etch process can be performed in order to selectively remove this material, thereby creating a self-aligned airgap (see FIG. 13). For example, in the case of a germanium (Ge) or silicon germanium (SiGe) sacrificial liner 703, a fluorine (F)-based and, particularly, a tetrafluoromethane ($CF_4$)-based reactive ion etch (RIE) process can be used to remove the remaining portions of the sacrificial liner 703. It should be noted that since the openings 126 in the additional dielectric liner 126 are sub-lithographic, deposition of interlayer dielectric materials during subsequent back end of the line (BEOL) processing will cap the openings 126 without destroying the airgap.

It should be noted that any one of various techniques known in the art for forming such sub-lithographic openings 126 could be used. For example, in one embodiment, a periodic chemical pattern can be formed on the top surface of the additional dielectric layer 121 such that adjacent sections of the top surface of the additional dielectric layer 121 have contrasting chemical functionalities. This chemical pattern can be formed, for example, using known exposure tools capable of resolving patterns having dimensions of 50 nm or even less. Next, a copolymer mixture (e.g., a mixture of polystyrene (PS) and poly-(methylmethacrylate) (PMMA) or any other suitable block polymer materials) can be applied to the additional dielectric layer above the chemical pattern and an anneal process can be performed. The anneal process causes self-assembly of different polymer sections registered with the periodic chemical pattern previously formed on the top surface of the additional dielectric layer 121 (i.e., alternating first and second polymer sections). Those skilled in the art will recognize that the different polymer sections generated by the anneal process will depend upon the chemical pattern and the mass ratio of the block polymers used. Next, either the first polymer sections or the second polymer sections can be selectively removed, leaving a periodic pattern of sub-lithographic openings and, thereby creating a diblock copolymer mask. Once this diblock copolymer mask is formed, the pattern of sub-lithographic openings can be transferred in to the additional dielectric layer 121 (e.g., using an anisotropic etch process) and the diblock copolymer mask can be removed.

In any case, this process 614 results in the formation of contact sidewall spacers 150 adjacent to corresponding contacts 130 (as shown in FIG. 13). Specifically, each contact sidewall spacer 150 will comprise an airgap 151, which is formed when the degradable material of the sacrificial liner 703 is degraded, and a dielectric liner 152 (namely, the remaining vertical portion of the dielectric liner 704) positioned laterally between the airgap 151 and the contact sidewall 133. This process 614 can also result in the formation of additional contact sidewall spacer(s) 160 adjacent to corresponding additional contact(s) 140. Like the contact sidewall spacers 150, each additional contact sidewall spacer 160 will comprise an additional airgap 161, which is formed when the degradable material of the sacrificial liner 703 degrades, and an additional dielectric liner 162 (namely, the remaining vertical portion of the dielectric liner 704) positioned laterally between the additional airgap 161 and the additional contact sidewall 143.

It should be noted that due to the process steps described above the airgap 151 of each contact sidewall spacer 150 may comprise a vertical portion 154 and a relatively short horizontal portion 153 that extends laterally from the vertical portion 154 below the dielectric liner 152 to the contact sidewall 133. Thus, the dielectric liner 152 may be physically separated from the top surface of the semiconductor device 110. Similarly, the additional airgap 161 of each additional contact sidewall spacer 160 may comprise an additional vertical portion 164 and a relatively short additional horizontal portion 163 that extends laterally from the vertical portion 164 below the additional dielectric liner 162 to the contact sidewall 143. Thus, the additional dielectric liner 162 may be physically separated from the top surface of the layer (e.g., the insulator layer 102 or semiconductor substrate 101) being contacted.

Furthermore, it should be noted that the width 155 of the contact sidewall spacer 150 will be essentially uniform (i.e., the width of the contact sidewall spacer will be essentially from the semiconductor device 110 and to the top surface 125 of the dielectric layer(s) 120) and will be approximately equal to the sum of the thicknesses of the sacrificial liner 703 formed at process 604 and the dielectric liner 704 formed at process 606. The sacrificial liner 703 and the dielectric liner 704 can each have a width ranging from less than 1 nm to greater than 10 nm. In one exemplary embodiment, the thickness of the sacrificial liner 703 may be approximately 2 nm and the thickness of the dielectric liner 704 may be approximately 2-3 nm and, thus, the full width 155 of the resulting contact sidewall spacer 150 may be approximately 4-5 nm. In this case, the widths of the openings 701 and any additional openings 702 patterned and etched at process 602 should be 8-10 nm wider than the desired widths of the contacts to be formed therein.

Lastly, it should be noted that, in the case of a FET, each opening 701 that extends vertically through the dielectric layer(s) 120 to a source/drain region 112 can be patterned and etched at process 602 such that the outer edge of the opening 701 abuts an adjacent gate sidewall spacer 116. As a result, the width 155 of the contact sidewall spacer 150 will be approximately equal to the distance 156 between the contact sidewall 133 and the outer edge of the gate sidewall spacer 116.

Figure 15:
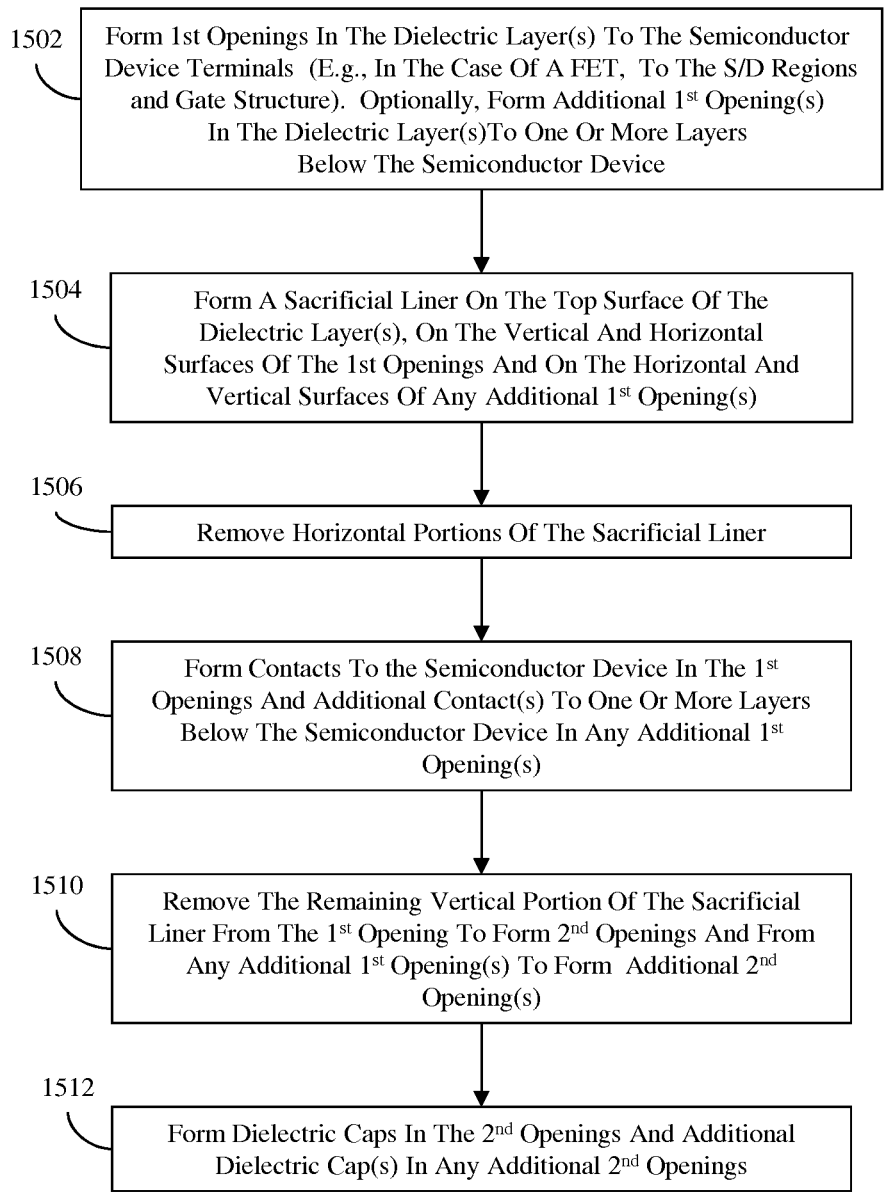
FIG. 15 is a flow diagram illustrating an exemplary technique for performing the processes 308-310 of FIG. 3 in order to form the semiconductor structure of FIG. 2.

Alternatively, FIG. 15 is a flow diagram illustrating an exemplary technique for performing the processes 308-310 resulting in the semiconductor structure 200 of FIG. 2.

Figure 16:
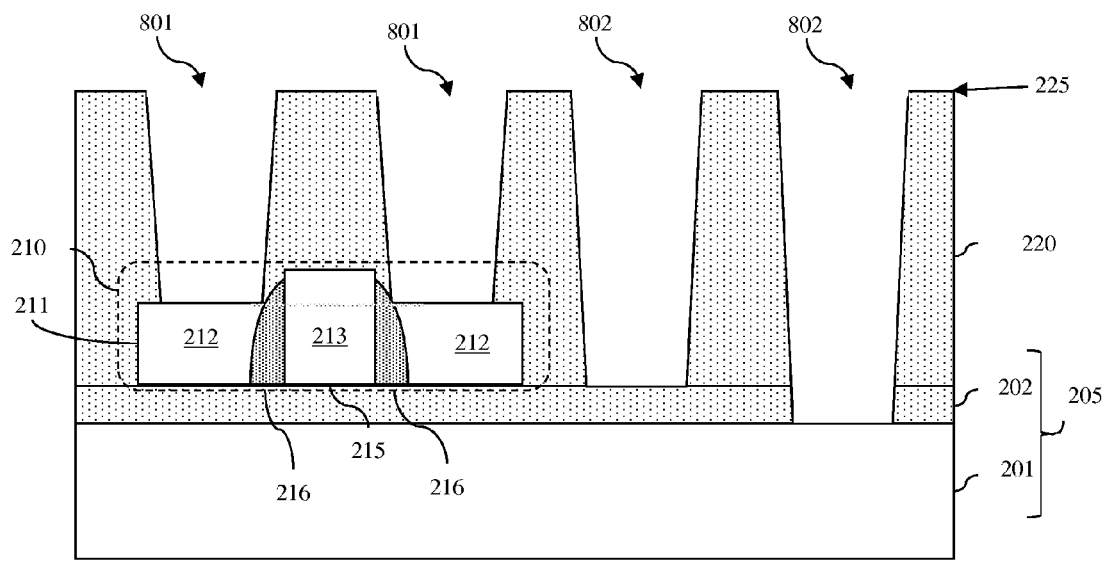
FIG. 16 is a diagram illustrating a partially completed semiconductor structure formed using the technique of FIG. 15.

Specifically, referring to FIG. 15, the processes 308-310 can begin by forming first openings 801 in the dielectric layer(s) 220 extending vertically from the top surface 225 of the dielectric layer(s) 220 to the semiconductor device 210 and, particularly, to the terminals of the semiconductor device 210 (1502, see FIG. 16). For example, in the case of a FET, first openings 801 can be formed that extend vertically through the dielectric layer(s) 220 to the source/drain regions 212 (as shown) and also to the gate structure 215 (not shown)). Those skilled in the art will recognize that silicide layers are often formed on the surfaces of semiconductor device terminals for reduced resistance. For example, in the case of a FET, silicide layers are often formed on the surfaces of the source/drain regions and/or the gate structure. Thus, it should be understood that the first openings 801 may, optionally, land on silicide layers (not shown). Optionally, at process 1502, one or more additional first openings 802 can also be formed in the dielectric layer(s) 220 offset from the semiconductor device 210 (i.e., positioned laterally adjacent to the semiconductor device 210) and extending vertically from the top surface 225 of dielectric layer(s) 220 to one or more layers below the semiconductor device 210 (e.g., to an insulator layer 202 or semiconductor substrate 201 below the semiconductor device 210). The first openings 801 and any additional first opening(s) 802 can be formed using conventional lithographic patterning and reactive ion etch (RIE) techniques or any other suitable patterning and etch techniques.

Figure 17:
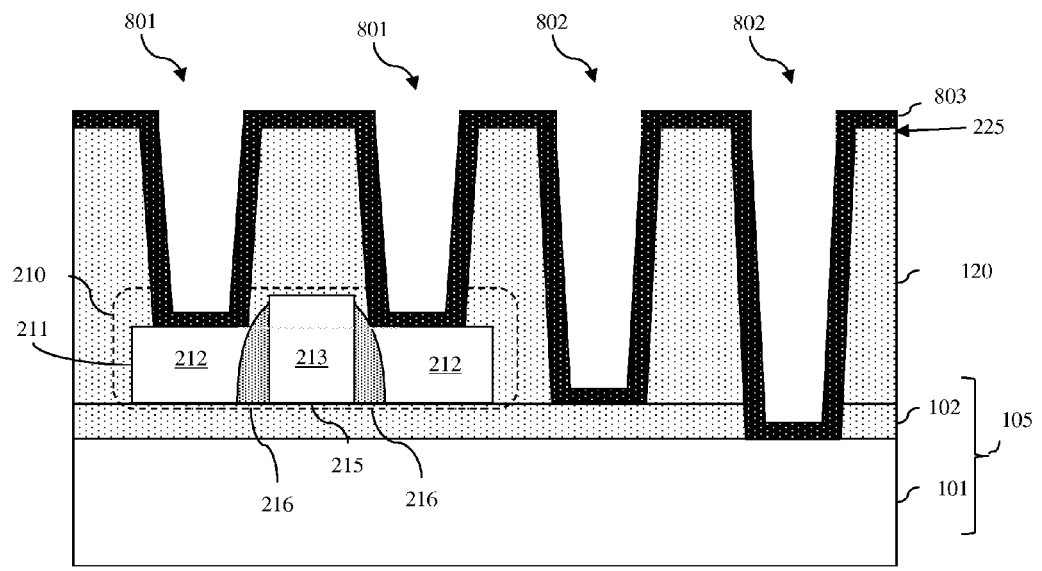
FIG. 17 is a diagram illustrating a partially completed semiconductor structure formed using the technique of FIG. 15.

Next, a sacrificial liner 803 can be formed (e.g., deposited) so as to conformally cover the top surface 225 of the dielectric layer(s) 220, the vertical and horizontal surfaces of the openings 801 and the horizontal and vertical surfaces of any additional opening(s) 802 (1504, see FIG. 17). This sacrificial liner 803 can comprise, for example, any material that can be selectively etch at processes 1506 and 1510, described in detail below. In one exemplary embodiment, this sacrificial layer 801 can comprise a germanium (Ge) or silicon germanium (SiGe) layer.

Figure 18:
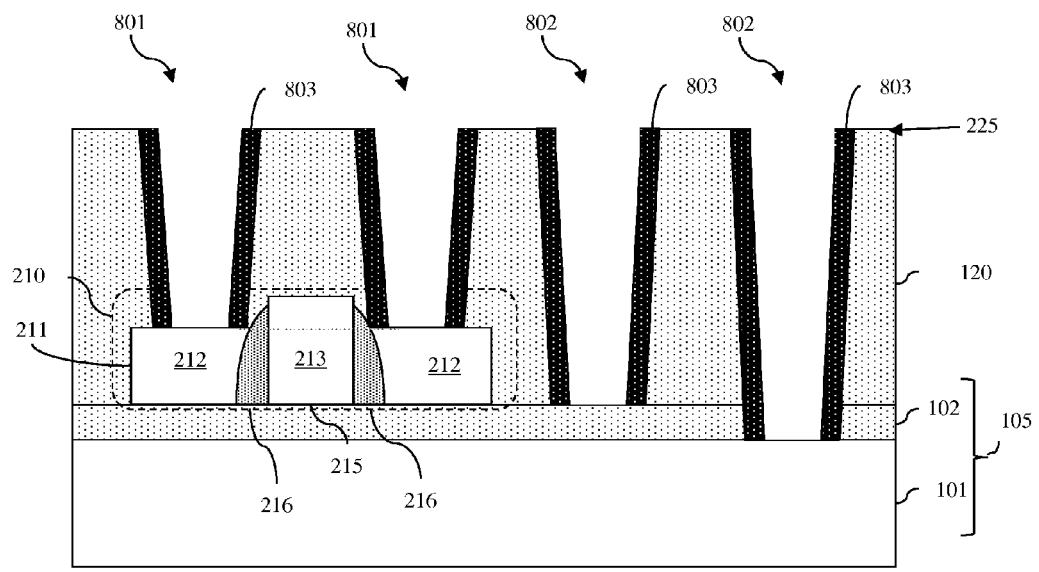
FIG. 18 is a diagram illustrating a partially completed semiconductor structure formed using the technique of FIG. 15.

Then, horizontal portions of the sacrificial liner 803 can be removed from the top surface 225 of the dielectric layer(s) 220, from the first openings 801 and from any additional first openings 802 (1506, see FIG. 18). Removing the horizontal portions of the sacrificial liner 803 from the first openings 801 will expose surfaces of the terminals of the semiconductor device 210 to be contacted and, similarly, removing the horizontal portions of the sacrificial liner 703 from any additional first opening(s) 802 will expose surface(s) of the layers below the semiconductor device 210 to be contacted. To remove the horizontal portions of the sacrificial liner 803a directional etch process (e.g., a plasma etch process) can be performed. For example, in the case of a germanium (Ge) or silicon germanium (SiGe) sacrificial liner 803, a fluorine (F)-based and, particularly, a tetrafluoromethane ($CF_4$)-based reactive ion etch (RIE) process can be used to remove the horizontal portions of the sacrificial liner 803.

Figure 19:
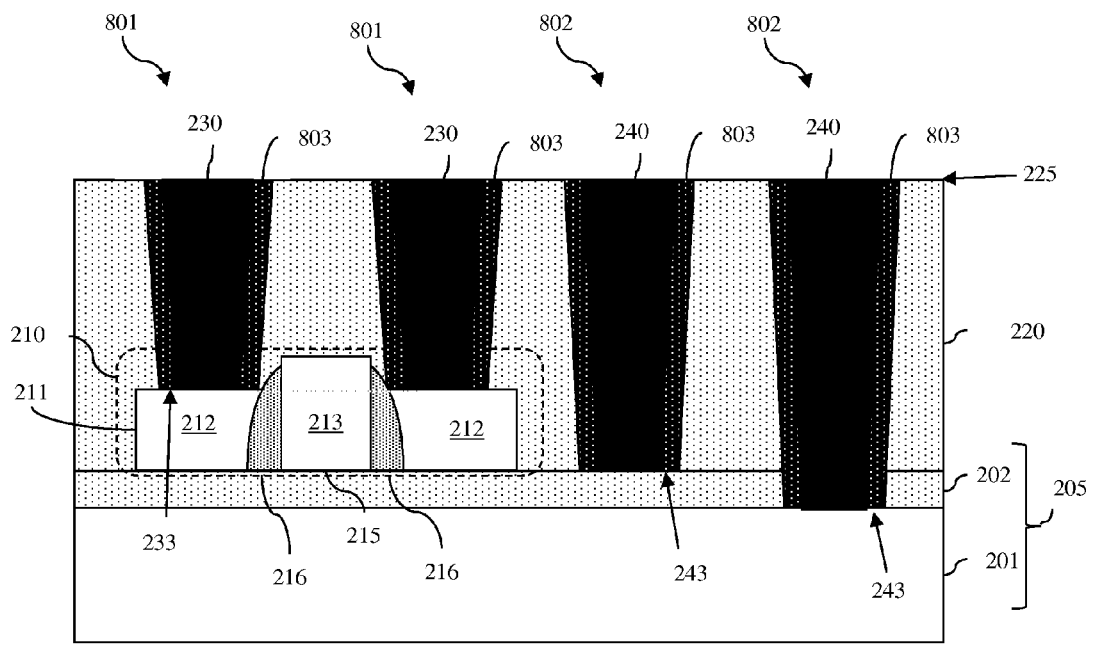
FIG. 19 is a diagram illustrating a partially completed semiconductor structure formed using the technique of FIG. 15.

Once the horizontal portions of the sacrificial liner 803 are removed from the first openings 801 and any additional first openings 802, contacts 230 can be formed in the first openings 801 such that each contact 230 has a sidewall 233 and extends vertically through the dielectric layer(s) 220 to a terminal of the semiconductor device 210 (e.g., in the case of a FET, to a source/drain region 212 (as shown) or the gate structure 215 (not shown)) (1508, see FIG. 19). At process 1508, additional contact(s) 240 can also be formed in any additional first opening(s) 802 such that each additional contact 240 has an additional sidewall 243 and extends vertically through the dielectric layer(s) 220 to a layer below the semiconductor device 210 (e.g., to an insulator layer 202 or a semiconductor substrate 201 below the semiconductor device 210). To form the contacts 230 and any additional contact(s) 240, the first openings 801 and any additional first opening(s) 802 can be filled with a conductive body (i.e., a conductive plug). This conductive body can comprise a metal, a metal alloy, or a layered combination of metals and/or metal alloys including, but not limited to, any of the following: tungsten (W), copper (Cu), aluminum (Al), titanium (Ti), tantalum (Ta), tungsten nitride (WN), titanium nitride (TiN), tantalum nitride (TaN), ruthenium (Ru), rhodium (Rh), or any other suitable metal or metal alloy. Techniques for forming such conductive bodies are well known in the art and, thus, the details thereof are omitted from this specification in order to allow the reader to focus on the salient aspects of the disclosed embodiments.

Figure 20:
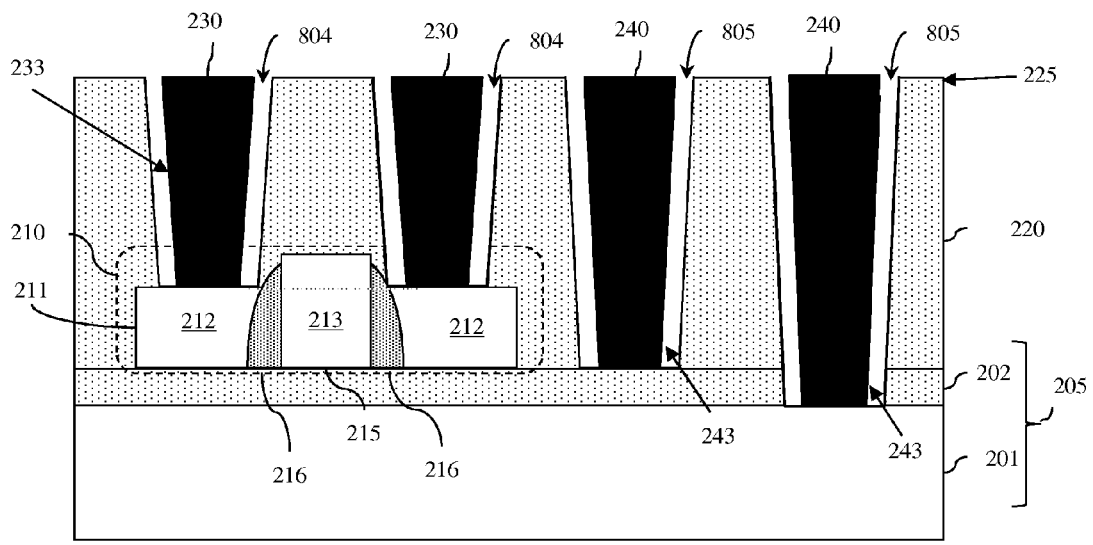
FIG. 20 is a diagram illustrating a partially completed semiconductor structure formed using the technique of FIG. 15.

After forming the contacts 230 and any additional contacts 240 at process 1508, any metal or metal alloy material remaining on the top surface 225 of the dielectric layer(s) 220 can be removed (e.g., using a chemical mechanical polishing (CMP) process). Then, vertical portions of the sacrificial liner 803 remaining in the first openings 801 and any additional first openings 802 can be selectively removed to form self-aligned airgaps (i.e., self-aligned air cavities) (1510, see FIG. 20). Specifically, vertical portions of the sacrificial liner 803 remaining in the first openings 801 and any additional first openings 802 can be selectively removed so as to form corresponding second openings 804, which expose the sidewalls 233 of the contacts 230, and, if applicable, additional second opening(s) 805, which expose the sidewalls 243 of any additional contact(s) 240. Those skilled in the art will recognize that the etch process used to remove the vertical portions of the sacrificial liner 803 at process 1510 will vary depending upon the materials used for the sacrificial liner 803, the contacts 230 (and any additional contacts 240) and the dielectric layer(s) 220. For example, if the sacrificial liner 803 comprises a germanium (Ge) layer, the dielectric layer 220 comprises a silicon dioxide (SiO2) layer and the contacts 230 and any additional contacts 240 comprise tungsten (W), then a chromium (Cr)-based wet etch process can be used at process 1510 to remove the remaining vertical portions of the sacrificial layer 803. However, if the sacrificial liner 803 comprises a germanium (Ge) layer, the dielectric layer 220 comprises a silicon dioxide (SiO2) layer and the contacts 230 and any additional contacts 240 comprise rhodium (Rh) or copper (Cu), then a peroxide ($H_2O_2$)-based wet etch process can be used at process 1510 to remove the remaining vertical portions of the sacrificial layer 803.

Finally, dielectric caps 252 can be formed in the top of the second openings 804 and additional dielectric cap(s) 262 can be formed in the top of any additional second opening(s) 805 particularly to prevent metal plating in the self-aligned airgaps during subsequent BEOL wire and/or interconnect formation (1512, see FIG. 2). To form such dielectric caps 252, 262, an additional dielectric layer can be formed (e.g., deposited) on the top surface 225 of the dielectric layer(s) 220 such that dielectric material only fills the tops of the second openings 804 and any additional second opening(s) 805 (e.g., due to the relatively high aspect ratios of these openings). This additional dielectric layer can comprise a different dielectric material than that at the top surface of the dielectric layer(s). For example, this additional dielectric layer can comprise a silicon nitride (SiN) layer, a silicon oxynitride (SiON) layer, or any other suitable dielectric layer). Then, the additional dielectric layer can be etched back so as to remove it from the top surface 225 of the dielectric layer(s) 220. This process 1512 can result in the formation of contact sidewall spacers 250 adjacent to corresponding contacts 230, where each contact sidewall spacer 250 comprises an airgap 251 positioned laterally adjacent to a lower portion 236 of the contact sidewall 233 and a dielectric cap 252 (namely, the portion of the additional dielectric layer remaining within the top of a second opening 804) above the airgap 251 and positioned laterally adjacent to an upper portion of the contact sidewall 233. This process 1512 can also result in the formation of additional contact sidewall spacer(s) 260 adjacent to corresponding additional contact(s) 240, where, like the contact sidewall spacers 250, each additional contact sidewall spacer 260 will comprise an additional airgap 261 positioned laterally adjacent to a lower portion 246 of the additional contact sidewall 243 and an additional dielectric cap 262 (namely, the portion of the additional dielectric layer remaining within the top of an additional second opening 805) above the additional airgap 251 and positioned laterally adjacent to an upper portion of the additional contact sidewall 243.

It should be noted that the width 255 of the contact sidewall spacer 250 will be essentially uniform (i.e., the airgap 251 and dielectric cap 252 above the airgap 251 will be the same) and will be equal to the thicknesses of the sacrificial liner 803 formed at process 1504. The thickness of the sacrificial liner 803 can range, for example, from less than 2 nm to greater than 20 nm. In one exemplary embodiment, the thickness of the sacrificial liner 803 may be approximately 2 nm and, thus, the full width 255 of the resulting contact sidewall spacer 250 may also be approximately 2 nm. In this case, the widths of the first openings 801 and any additional first openings 802 patterned at process 1502 should be approximately 4 nm wider than the desired widths of the contacts to be formed therein. Lastly, it should be noted that, in the case of a FET, each first opening 801 that extends vertically through the dielectric layer(s) 220 to a source/drain region 212 can be patterned and etched at process 1502 such that the outer edge of the opening 801 abuts an adjacent gate sidewall spacer 216. As a result, the width 255 of the contact sidewall spacer 250 will be approximately equal to the distance 256 between the contact sidewall 233 and the outer edge of the gate sidewall spacer 216.

In each of the above-describe techniques set forth in the flow diagrams of FIG. 6 and FIG. 15, since the air or gas in the airgaps of resulting contact sidewall spacers has a lower dielectric constant than other typically used dielectric spacer or interlayer dielectric materials (e.g., a lower dielectric constant than silicon dioxide ($SiO_2$), borophosphosilicate glass (BPSG) layer, silicon nitride (SiN) or silicon oxynitride (SiON)), the size of the corresponding contacts can be increased for reduced parasitic resistance while minimizing corresponding increases in parasitic capacitance or the probability of shorts with any adjacent conductive structure (e.g., with an adjacent gate structure, with an adjacent contact, etc.).

Referring again to FIG. 3 in combination with FIGS. 1 and 2, after the processes 308-310 are performed, conventional back end of the line (BEOL) processing can be performed to electrically connect BEOL wires and/or interconnects, which are formed above the top surface 125, 225 of the dielectric layer(s), to the MOL contacts 130, 230 connected to the semiconductor device 110, 210 as well as to any MOL additional contacts 140, 240 connected to layers below the semiconductor device 110, 210 (312).

It should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed embodiments.

Therefore, disclosed above are embodiments of a semiconductor structure that optimizes semiconductor device performance and reliability by incorporating a contact sidewall spacer with a self-aligned airgap. Specifically, the semiconductor structure can comprise a semiconductor device (e.g., a two-terminal semiconductor device, such as a PN junction diode or Schottky diode, or a three-terminal semiconductor device, such as a field effect transistor (FET), a bipolar junction transistor (BJT) or a thrysistor) and a dielectric layer that covers the semiconductor device. A contact can extend vertically through the dielectric layer to the semiconductor device (e.g., in the case of a FET, to a source/drain region of the FET). A contact sidewall spacer can be positioned laterally adjacent to the sidewall of the contact and can incorporate an airgap. Since air has a lower dielectric constant than other typically used dielectric spacer or interlayer dielectric materials, the contact size can be increased for reduced parasitic resistance while minimizing corresponding increases in parasitic capacitance or the probability of shorts. Also disclosed herein are embodiments of a method of forming such a semiconductor structure.

What is claimed is:
1. A semiconductor structure comprising a semiconductor device;
   a dielectric layer covering said semiconductor device;
   a contact having a sidewall and extending vertically through said dielectric layer to said semiconductor device; and a contact sidewall spacer extending vertically through said dielectric layer to said semiconductor device,
said contact sidewall spacer being positioned laterally around said contact immediately adjacent to said sidewall,
said contact sidewall spacer having an essentially uniform width around said contact, and
said contact sidewall spacer comprising an airgap.

2. The semiconductor structure of claim 1, said airgap being positioned laterally adjacent to a lower portion of said sidewall and said contact sidewall spacer further comprising a dielectric cap above said airgap and positioned laterally adjacent to an upper portion of said sidewall.

3. The semiconductor structure of claim 2, said dielectric cap comprising a different dielectric material than said dielectric layer.

4. The semiconductor structure of claim 1, said contact sidewall spacer further comprising a dielectric liner positioned laterally between said airgap and said sidewall.

5. The semiconductor structure of claim 4, said dielectric liner comprising a different dielectric material than said dielectric layer.

6. The semiconductor structure of claim 1, further comprising:
an additional contact having an additional sidewall, being positioned laterally adjacent to said semiconductor device and extending vertically through said dielectric layer to a top surface of any one of an insulator layer and a semiconductor substrate below said semiconductor device; and
an additional contact sidewall spacer extending vertically through said dielectric layer to said top surface,
said additional contact sidewall spacer being positioned laterally around said additional contact immediately adjacent to said additional sidewall,
said additional contact sidewall spacer having an essentially uniform width around said additional contact, and
said additional contact sidewall spacer comprising an additional airgap.

7. The semiconductor structure of claim 1, said semiconductor device comprising any of a two-terminal semiconductor device and a three-terminal semiconductor device.

8. A semiconductor structure comprising
a field effect transistor comprising:
a semiconductor body comprising:
a channel region; and
a source/drain region adjacent to said channel region; and
a gate structure on said semiconductor body adjacent to said channel region;
a dielectric layer covering said field effect transistor;
a contact having a sidewall and extending vertically through said dielectric layer to said source/drain region; and
a contact sidewall spacer extending vertically through said dielectric layer to said source/drain region,
said contact sidewall spacer being positioned laterally around said contact immediately adjacent to said sidewall,
said contact sidewall spacer having an essentially uniform width around said contact, and
said contact sidewall spacer comprising an airgap.

9. The semiconductor structure of claim 8, said airgap being positioned laterally adjacent to a lower portion of said sidewall and said contact sidewall spacer further comprising a dielectric cap above said airgap and positioned laterally adjacent to an upper portion of said sidewall.

10. The semiconductor structure of claim 9, said dielectric cap comprising a different dielectric material than said dielectric layer.

11. The semiconductor structure of claim 8, said contact sidewall spacer further comprising a dielectric liner positioned laterally between said airgap and said sidewall.

12. The semiconductor structure of claim 11, said dielectric liner comprising a different dielectric material than said dielectric layer.

13. The semiconductor structure of claim 8, further comprising:
an additional contact having an additional sidewall, being positioned laterally adjacent to said field effect transistor and extending vertically through said dielectric layer to a top surface of any one of an insulator layer and a semiconductor substrate below said field effect transistor; and
an additional contact sidewall spacer extending vertically through said dielectric layer to said top surface,
said additional contact sidewall spacer being positioned laterally around said additional contact immediately adjacent to said additional sidewall,
said additional contact sidewall spacer having an essentially uniform width around said additional contact, and
said additional contact sidewall spacer comprising an additional airgap.

14. The semiconductor structure of claim 8, said essentially uniform width being approximately equal to a distance between said sidewall and an outer edge of a gate sidewall spacer on said gate structure.

15. A semiconductor structure comprising
a semiconductor device;
a dielectric layer covering said semiconductor device;
a contact having a sidewall and extending vertically through said dielectric layer to said semiconductor device; and
a contact sidewall spacer extending vertically through said dielectric layer to said semiconductor device,
said contact sidewall spacer being positioned laterally around said contact immediately adjacent to said sidewall,
said contact sidewall spacer having an essentially uniform width around said contact, and
said contact sidewall spacer comprising:
a dielectric liner immediately adjacent to said sidewall; and
an airgap between said dielectric liner and said dielectric layer.

16. The semiconductor structure of claim 15, said airgap having a portion that extends laterally below said dielectric liner to said sidewall such that said dielectric liner is physically separated from said semiconductor device.

17. The semiconductor structure of claim 15, said dielectric liner comprising a different dielectric material than said dielectric layer.

18. The semiconductor structure of claim 15, said dielectric liner comprising a silicon nitride liner.

19. The semiconductor structure of claim 15, further comprising:
an additional contact having an additional sidewall, being positioned laterally adjacent to said semiconductor device and extending vertically through said dielectric layer to a top surface of any one of an insulator layer and a semiconductor substrate below said semiconductor device; and
an additional contact sidewall spacer extending vertically through said dielectric layer to said top surface, said additional contact sidewall spacer being positioned laterally around said additional contact immediately adjacent to said additional sidewall, said additional contact sidewall spacer having an essentially uniform width around said additional contact, and said additional contact sidewall spacer comprising: an additional dielectric liner immediately adjacent to said additional sidewall and an additional airgap between said additional dielectric liner and said dielectric layer.

20. The semiconductor structure of claim 15, said semiconductor device comprising any of a two-terminal semiconductor device and a three-terminal semiconductor device.

21. A semiconductor structure comprising
a field effect transistor comprising:
  a semiconductor body comprising:
    a channel region; and
    a source/drain region adjacent to said channel region; and
  a gate structure on said semiconductor body adjacent to said channel region;
a dielectric layer covering said field effect transistor;
a contact having a sidewall and extending vertically through said dielectric layer to said source/drain region; and
a contact sidewall spacer extending vertically through said dielectric layer to said source/drain region,
said contact sidewall spacer being positioned laterally around said contact immediately adjacent to said sidewall,
said contact sidewall spacer having an essentially uniform width around said contact, and
said contact sidewall spacer comprising: a dielectric liner immediately adjacent to said sidewall and an airgap between said dielectric liner and said dielectric layer, said airgap having a portion that extends laterally below said dielectric liner to said sidewall such that said dielectric liner is physically separated from said source/drain region.

22. The semiconductor structure of claim 21, said dielectric liner comprising a silicon nitride liner.

23. The semiconductor structure of claim 21, said dielectric liner comprising a different dielectric material than said dielectric layer.

24. The semiconductor structure of claim 21, further comprising:
an additional contact having an additional sidewall, being positioned laterally adjacent to said field effect transistor and extending vertically through said dielectric layer to a top surface of any one of an insulator layer and a semiconductor substrate below said field effect transistor; and
an additional contact sidewall spacer extending vertically through said dielectric layer to said top surface,
said additional contact sidewall spacer being positioned laterally around said additional contact immediately adjacent to said additional sidewall,
said additional contact sidewall spacer having an essentially uniform width around said additional contact, and
said additional contact sidewall spacer comprising: an additional dielectric liner immediately adjacent to said additional sidewall and an additional airgap between said additional dielectric liner and said dielectric layer.

25. The semiconductor structure of claim 21, said essentially uniform width being approximately equal to a distance between said sidewall and an outer edge of a gate sidewall spacer on said gate structure.

* * * * *